United States Patent [19]

Uhling et al.

[11] Patent Number: 5,428,204
[45] Date of Patent: Jun. 27, 1995

[54] ACTIVE TRIM METHOD AND APPARATUS

[75] Inventors: Thomas F. Uhling, Monument; Philip J. Yearsley, Colorado Springs; Dale L. Pittock, Colorado Springs; Mark E. Mathews, Colorado Springs, all of Colo.

[73] Assignee: Hewlett-Packard Company, Palo Alto, Calif.

[21] Appl. No.: 182,925

[22] Filed: Jan. 18, 1994

Related U.S. Application Data

[62] Division of Ser. No. 937,626, Aug. 28, 1992.

[51] Int. Cl.$^6$ ............................................. B23K 26/00
[52] U.S. Cl. ................................. 219/121.68; 29/593
[58] Field of Search ................... 219/121.68, 121.69, 219/121.83, 68, 69.1; 437/171; 29/593, 612

[56] References Cited

U.S. PATENT DOCUMENTS

| | | | |
|---|---|---|---|
| 3,827,142 | 8/1974 | Bennett et al. | 29/620 |
| 4,021,898 | 5/1977 | Willis et al. | 219/121.69 X |
| 4,149,064 | 4/1979 | Houska et al. | 219/121.68 |
| 4,403,133 | 9/1983 | Turner et al. | 219/121.69 |
| 4,564,736 | 1/1986 | Jones | 219/121.68 X |
| 4,907,341 | 3/1990 | Chapel, Jr. et al. | 29/612 |

*Primary Examiner*—Geoffrey S. Evans

[57] ABSTRACT

An electronic probe circuit having ac and dc amplifiers and an input compensation subcircuit is enclosed within a trim housing that replicates the electrical effect of the probe housing. The circuit is laser trimmed through ports in the trim housing. The difference between the voltage at 80 nsec and 1.4 $\mu$sec points on a step voltage provides a first calibration factor while the difference between the 3 nsec voltage and the 80 nsec voltage provides a second calibration factor. A resistor in the DC amplifier is trimmed to an absolute voltage with a step scan laser cut. A resistor in the AC amplifier is trimmed with a laser L-cut until the difference between the 80 nsec and 1.4 $\mu$sec points of the step voltage equals the first calibration factor. A capacitor in the input compensation subcircuit is trimmed until the voltage difference between the 3 nsec and 80 nsec points equals the second calibration factor.

7 Claims, 24 Drawing Sheets

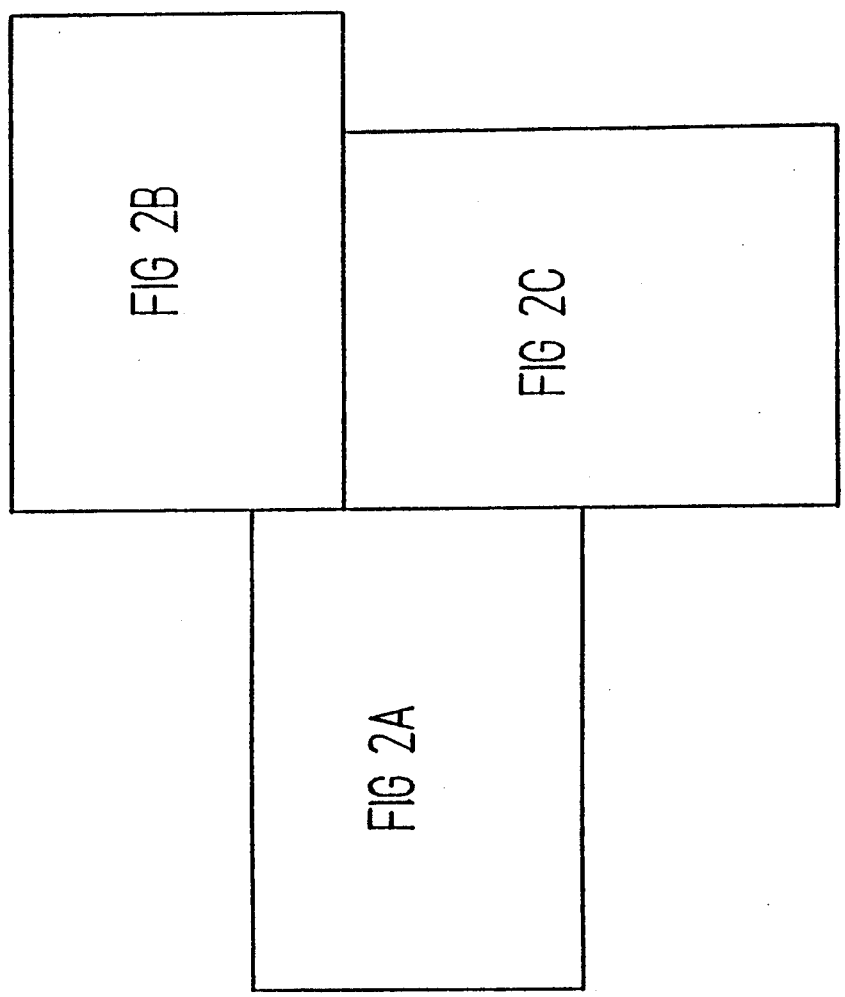

ACTIVE TRIM METHOD AND APPARATUS

CROSS REFERENCE TO RELATED APPLICATION

This is a divisional of copending application Ser. No. 07/937,626 filed on Aug. 28, 1992, pending.

BACKGROUND OF THE INVENTION

1. Field of the Invention

The invention in general relates to trimming or adjusting components of an electronic circuit so that the circuit performs within specifications, and more particularly to an automated process and apparatus for trimming components while the circuit is turned on or active.

2. Statement of the Problem

The process of trimming elements of an electronic circuit to bring the circuit within predetermined specifications is well known. For example, capacitors, resistors, inductors and other elements may be adjusted to cause the circuit to perform within set specifications. As other examples, electronic elements may be trimmed to cause a circuit to oscillate at a specified frequency, to set of an alarm at a specified threshold value, to amplify with a particular gain, or to amplify with a particular gain within a certain frequency range. The trimming may be done by adjusting the values of variable capacitors, resistors, or inductors with a set screw. Such manual adjustments can vary over time, thus more reliable methods of adjustment were developed, such as substituting one element for another, or adding or subtracting elements in a circuit. For example, a fuse may be melted to remove a one or more parallel resistors from a circuit to change the resistance of a portion of the circuit. As electronic circuits have become more sophisticated and capable of operating with higher degrees of accuracy, more sensitive ways of trimming circuits have been devised. One such method is the trimming of resistors or capacitors with lasers. This allows a tiny portion of the resistor or capacitor to be removed, thereby changing the electronic parameters of the circuit by a commensurate small amount. Since many circuit parameters vary with temperature and other factors that may be different when a circuit is turned on than they are when the circuit is turned off, when high accuracy is required in circuit specification, the trim is often done while the circuit is turned on. Trimming when the circuit is turned on is called "active trim".

Electronic circuits that are used to test other electronic circuits or to measure electronic values in other circuits must operate very accurately within predetermined specifications, since the accuracy of the circuits tested depends on the accuracy of the test instrument. Connections between the circuit to be tested and the test instruments, such as oscilloscopes, are generally made with an instrument called a test probe. The requirements for accuracy of operation within specification for test probes are extremely high, since any inaccuracies in the test probe will be passed through to, and may be multiplied by, the test instrument. The invention will be illustrated as applied to the trimming or adjustment of the operating parameters of an electronic test probe.

A test probe is essentially an impedance buffer, that is, a circuit with an output having a significantly different impedance than the impedance of its input. Generally, the voltage or other electrical parameter on the output of the test probe follows the voltage or other electrical parameter applied to its input. In addition, the nominal voltage at the input, that is, the voltage when the probe is not being applied to a circuit to be tested, is generally a zero voltage so that the probe does not apply any voltage to the circuit node to which it is applied. Further, the impedance at the input is as high as possible to prevent the test probe and test instrument to which it is connected from drawing significant current or otherwise significantly altering the electrical parameters on the node to be tested. The impedance of the output is generally a standard value, such as 50 ohms, to which the test instrument is designed to couple. Early test probes comprised simple conductors, such as a wire, and a few passive components, such as resistors, to provide an impedance buffer. Such passive test probes are adequate for connecting test equipment to circuits with DC or relatively low frequency electrical cycles. Present-day high frequency circuits require active probes, that is probes with active circuit elements, such as transistors, driven by a probe power source. Since the difference in the physical and electronic properties of such active elements when they are off and when they are on can be relatively large compared to the inaccuracies tolerable in an active probe, it is highly desirable that a very accurate method of active trim be available for such probes.

The frequencies of electrical signals that an active probe are called on to transmit to a test instrument can vary from the zero, in the case of DC signals, to several gigahertz, in the case of extremely fast digital circuits. Thus it is essential that such active probes have a response that is flat to a high degree of accuracy across a wide range of frequencies, generally called a band width (BW). As a result there is a need for a method and apparatus for actively trimming an active probe over a wide band width.

The problems of trimming electrical parameters at DC and high frequencies are considerably different. It is possible to measure accurate and stable electrical quantities, such as voltage, at the DC level. Thus the problems of trimming at the DC level relate to the need for obtaining and reliably reproducing absolute measurements. However, in the AC case, it is significantly harder to generate an accurate, stable AC voltage, whether it is a sine wave or step pulse. And accurate AC measurements are extremely hard to perform at very high frequencies. Thus there is a need for an active trim method and apparatus that produces results at the DC level that are consistent with results at high frequencies.

State-of-the-art active test probe designs are relatively complex and generally include several subcircuits and/or functions that must be individually trimmed. For example, the probe may contain a DC amplifier and an AC amplifier each of which must be adjusted to be flat. The specifications may require a specific input capacitance and a specific impedance attenuation. These circuits and functions are not independent, so that trimming one will generally affect the other. Thus there is a need for a method of trimming electronic circuits that permits accurate trimming to simultaneously meet a plurality of circuit constraints.

At the high accuracies of specifications and measurement which are applicable to active probes, factors that are insignificant with other circuits become significant. For example, the probe is sold and used within a probe housing, however, active trim must be done with the housing removed, since the elements such as resistors and capacitors that must be trimmed cannot otherwise be reached. The difference in electrical parameters of the probe within and outside of the housing are larger than the error tolerance of the trim function. Thus there is a need for a method and apparatus for active trim of an electronic circuit that can reproduce the actual conditions of use of the electronic circuit within a high degree of accuracy.

Electronic instruments such as probes are generally made in significant numbers. Manual testing of each probe can be very expensive and add considerably to the cost of the probe. Thus there is a need for a trim system that overcomes the above problems and is also performed automatically.

SOLUTION TO THE PROBLEM

The present invention solves the above problems by trimming the DC circuit to an absolute voltage using a precision voltage source and a precision voltmeter. The trim of the AC circuit is then referenced to the trim of the DC circuit.

The DC trim is done by laser trimming a resistor in the probe DC amplifier circuit until the desired absolute probe voltage attenuation is reached.

The referencing is done by first obtaining calibration factors that reference the AC voltages to a DC voltage, then adjusting the AC responses to match the calibration factors. The calibration factor is obtained by sending a step voltage through a circuit with a known response equivalent to the desired response of the probe circuit. The difference between the voltage at 80 nsec, where the step is essentially AC, and the voltage at 1.4 $\mu$sec, where the step is essentially DC, provides a first calibration factor. The difference between the voltage at 3 nsec and 80 nsec provides a second calibration factor that carries the calibration out to very high frequencies.

The high frequency AC trim is performed by applying the step voltage to the probe input, connecting the output to an averaging oscilloscope, and laser trimming a resistor in the AC amplifier until the difference between the 80 nsec voltage and the 1.4 $\mu$sec voltage equals the first calibration factor.

The input compensation trim is performed by applying the step voltage to the probe input, connecting the output to an averaging oscilloscope, and laser trimming a capacitor in the input compensation circuit until the difference between the 3 nsec voltage and the 80 nsec voltage equals the second calibration factor.

A step scan laser trim is used in the DC trim and an L-cut laser trim is used in the AC trim. These novel trim methods allow the trim to be performed rapidly while the output voltage is far from the target voltage, and to gradually be trimmed more slowly and accurately as the desired voltage value is reached.

During the trim the probe circuit board is enclosed in a trim housing that replicates the effect of the probe housing on the probe circuit. Ports in the trim housing allow the laser beam to reach the components to be trimmed.

SUMMARY OF THE INVENTION

The invention provides a method of trimming an electronic circuit having an electronic response over a wide band width, said method comprising the steps of: trimming the DC response of said circuit to an absolute DC value of a selected parameter; and trimming the AC response of said circuit to a value of said selected parameter that is referenced to said absolute DC value of said selected parameter. Preferably, said selected parameter is voltage. Preferably, said step of trimming the AC response comprises: inputting a step voltage to a calibration standard circuit having a known voltage response; measuring a calibration output step voltage of said calibration circuit; obtaining a first calibration voltage equal to the voltage difference between a first point on said calibration output step voltage representative of said AC response and a second point on said calibration output step voltage representative of said DC response; inputting said step voltage to said electronic circuit; measuring a circuit output step voltage of said electronic circuit and trimming said electronic circuit until the voltage difference between a first point on said circuit output step voltage corresponding to said first point on said calibration step voltage and a second point on said circuit output step voltage corresponding to said second point on said calibration output step voltage equals said first calibration voltage. Preferably, said first point is a first time measured from a zero time along said step voltage and said second point is a second time measured from said zero time along said step voltage, said second time being substantially longer than said first time. Preferably, said circuit includes an input compensation subcircuit, and AC amplifier subcircuit, and a DC amplifier subcircuit and said step of trimming said DC response comprises trimming said DC amplifier subcircuit; and said step of measuring and trimming comprises trimming said AC amplifier subcircuit; said method further including the steps of: obtaining a second calibration voltage equal to the voltage difference between a third time along said calibration output step voltage representative of the response of said input compensation circuit and said first time on said calibration output step voltage representative of said AC response; and measuring said output step voltage of said electronic circuit and trimming said input compensation subcircuit until the voltage difference between said third time along said circuit output step voltage and said first time along said circuit output step voltage equals said second calibration voltage. Preferably, said DC amplifier subcircuit includes a resistor and said step of trimming said DC amplifier subcircuit comprises making a step scan laser cut in said resistor. Preferably, said AC amplifier circuit includes a resistor and said step of trimming said AC amplifier subcircuit comprises making an L-cut in said resistor.

In another aspect the invention provides a method of trimming an electronic circuit including a resistor to a target value of a specified electronic parameter, said method comprising the steps of: applying electrical power to said circuit; measuring said electronic parameter; cutting into said resistor in a direction essentially perpendicular to the current flow axis in said resistor when said parameter is farther than a selected amount from said target value; and after said parameter reaches within said selected amount of said target value, turning said cut so as to cut in a direction essentially parallel to said axis of current flow. Preferably, said step of cutting comprises cutting out successive individual portions of said resistor with a laser, each of said successive individual portions being small compared to the total cut. Preferably, said step of cutting comprises cutting out larger individual portions of said resistor when said parameter is far from said target value than when said parameter draws close to said target value.

In still another aspect the invention provides a method of trimming an electronic circuit including a resistor to a target value of a specified electronic parameter, said method comprising the steps of: applying electrical power to said circuit; measuring said electronic parameter; and laser cutting said resistor with a step scan cut.

The invention also provides apparatus for trimming an electronic circuit, said apparatus comprising: absolute trim means for trimming said circuit to an absolute DC value of a selected electronic parameter; calibration means for providing a calibration factor relating an AC value of said parameter to said absolute DC value; and AC trim means for trimming the AC response of said circuit using said calibration factor. Preferably, said absolute trim means comprises a precision voltage source and a precision voltmeter. Preferably, said calibration means comprises a calibration circuit having a known output value of said parameter for a specified input value of said parameter, a step generator and an oscilloscope. Preferably, said oscilloscope includes means for averaging a plurality of measurements. Preferably, said AC trim means comprises said step generator, said oscilloscope, and a trimmable component of said circuit.

In a further aspect the invention provides apparatus for trimming an electronic instrument comprising an electronic circuit and an instrument housing for housing said circuit when it is in use, said apparatus comprising: trim housing means for replicating the effect of said instrument housing on said electronic circuit; and trim means for trimming said electronic circuit while it is enclosed in said trim housing. Preferably, said housing includes one or more ports and said trim means comprises a laser for trimming said circuit through said one or more ports.

The invention not only provides a method of trimming an electronic circuit that yields extremely high accuracy over wide band widths, but also provides a means of doing so relatively quickly and efficiently. Numerous other features, objects and advantages of the invention will become apparent from the following description when read in conjunction with the accompanying drawings.

BRIEF DESCRIPTION OF THE DRAWINGS

FIG. 2 is a figure map showing the arrangement of FIGS. 2A through 2C;

DESCRIPTION OF THE PREFERRED EMBODIMENT

1. Overview

Figure 1:
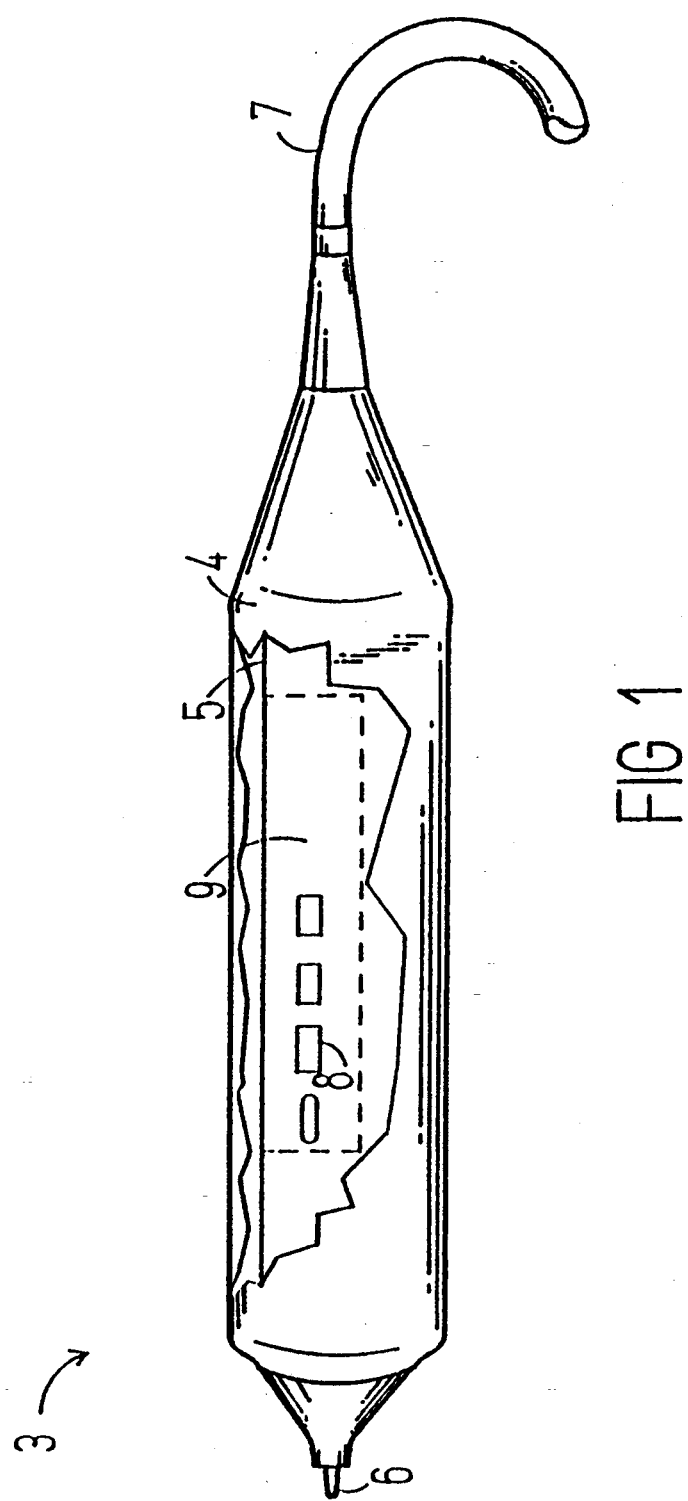
FIG. 1 is a sketch of an electronic test probe with the probe body partially cut away to expose the probe circuit.
Figure 2A:
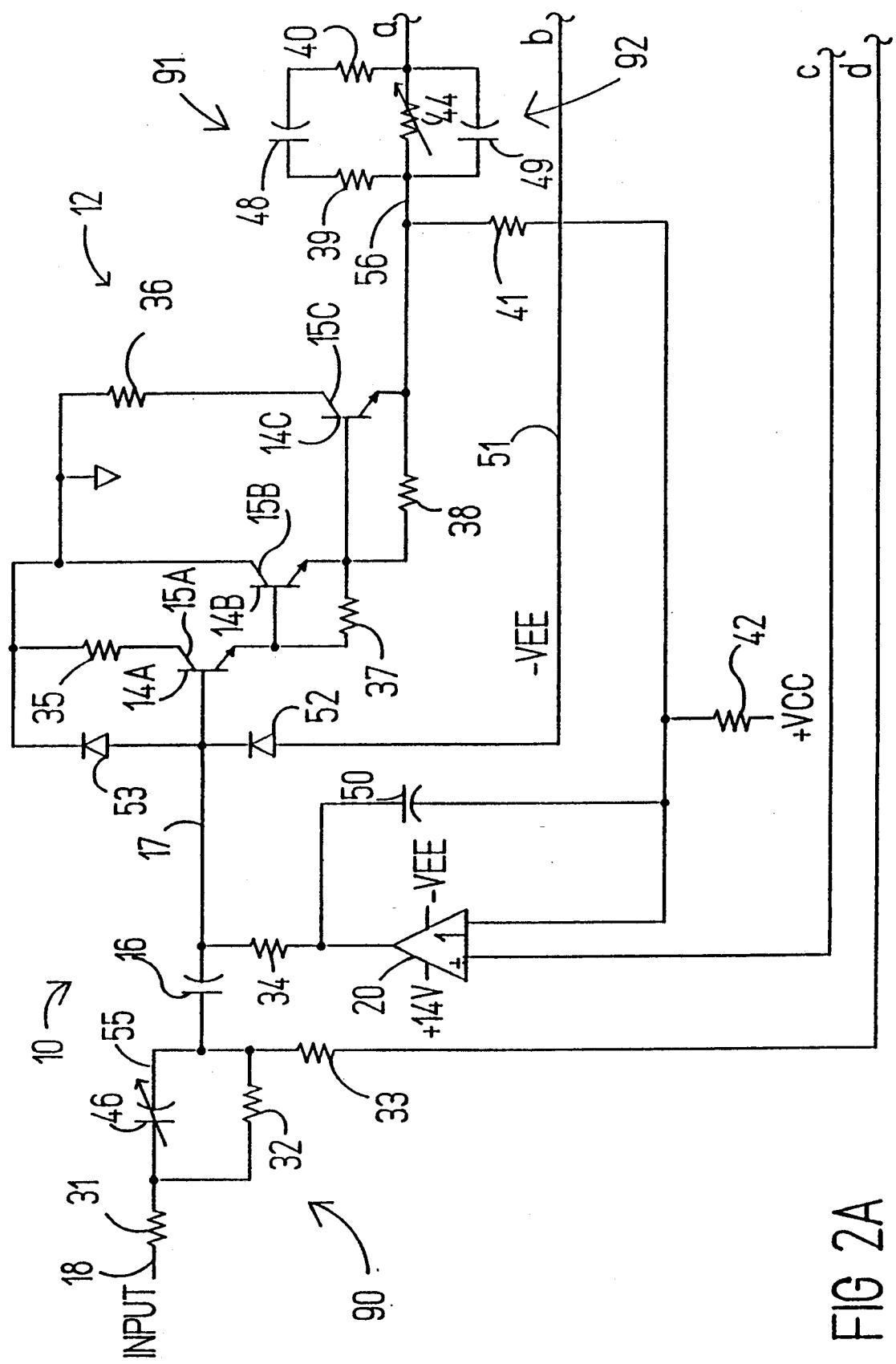
FIGS. 2A through 2C are a detailed circuit diagram of the preferred embodiment of the test probe circuit according to the invention.
Figure 2B:
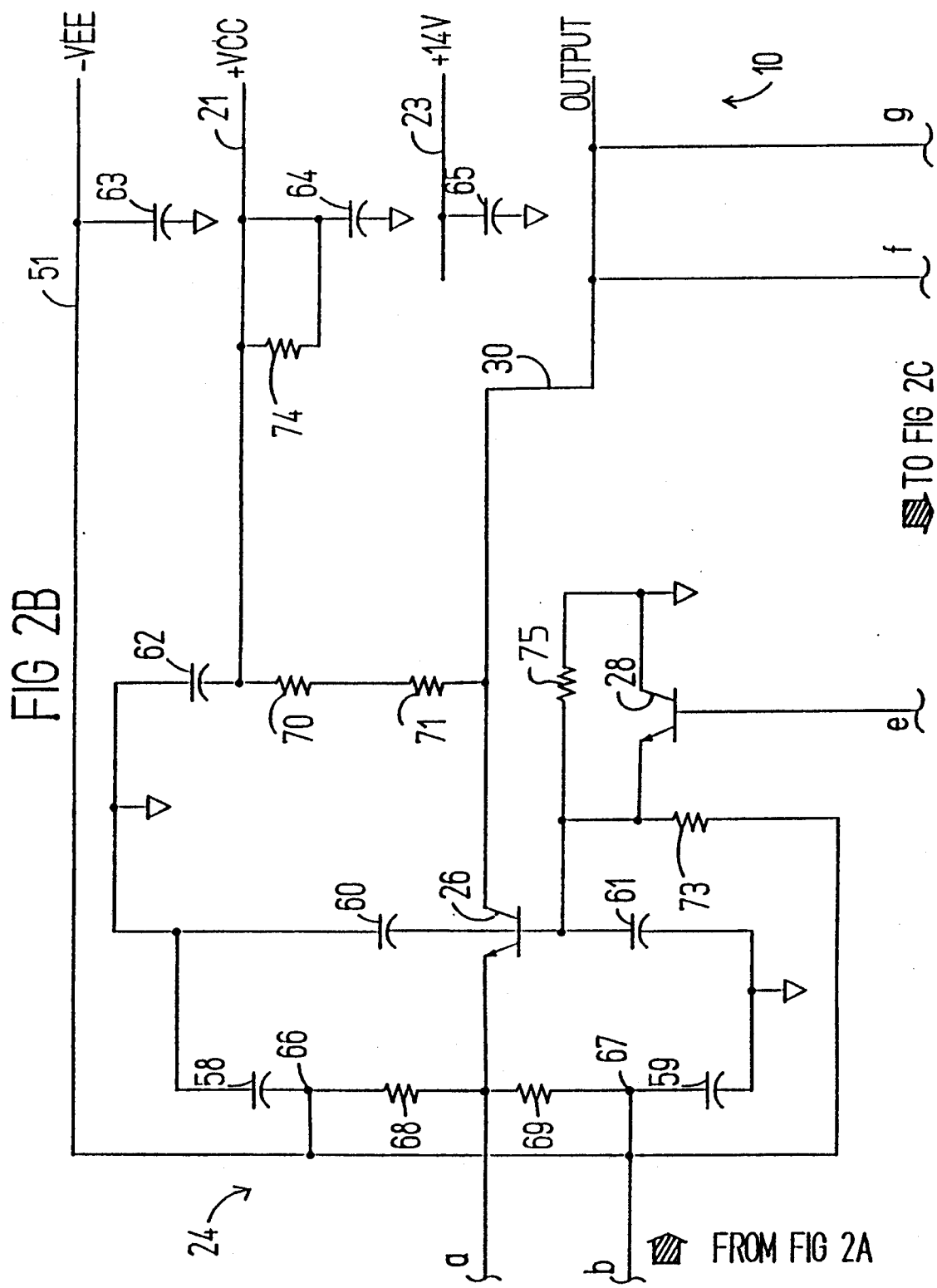
Figure 2C:
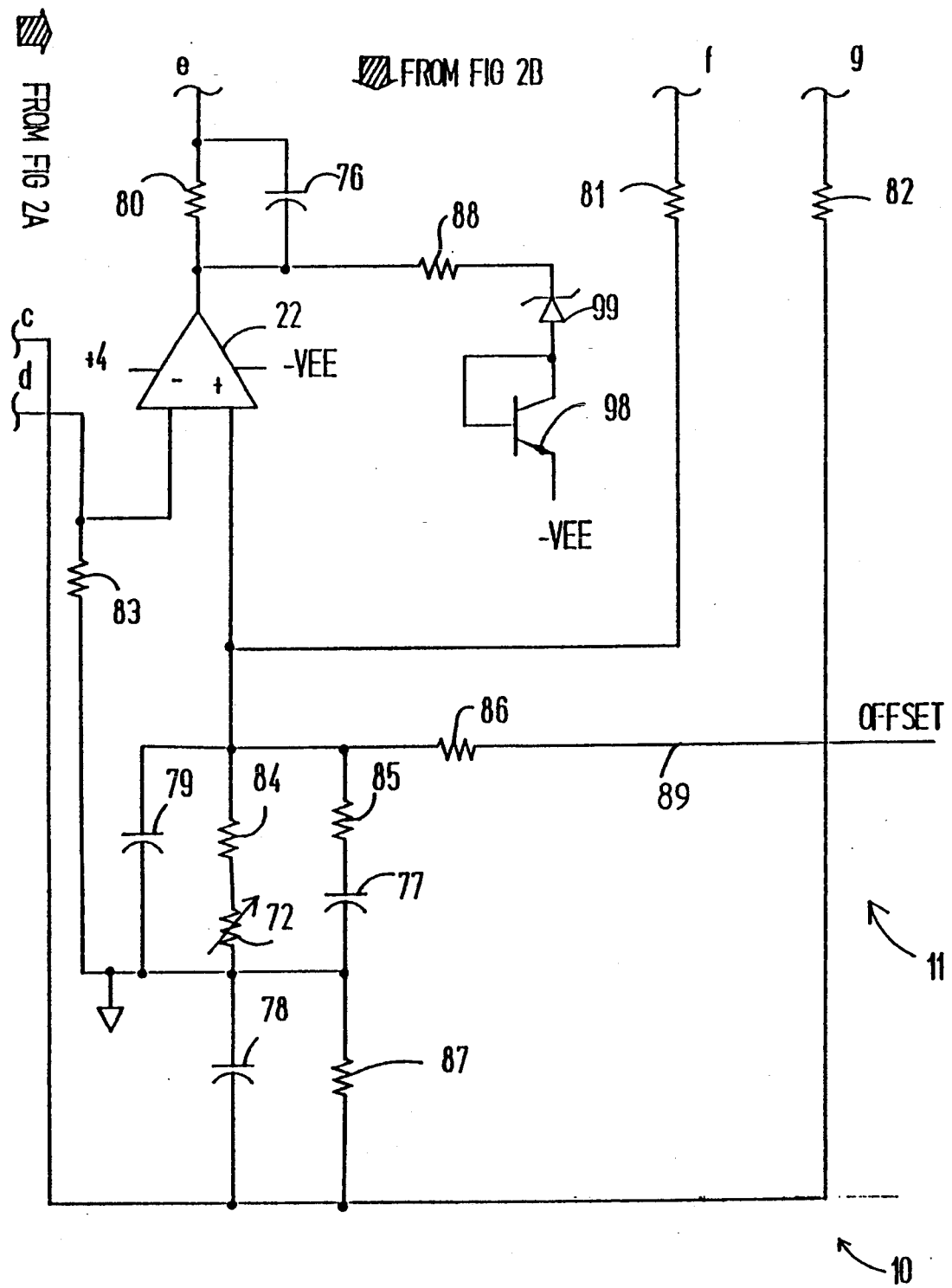

FIG. 1 shows an electronic test probe 3 with the probe housing 4 partially cut away. The probe 3 comprises a probe housing 4 which is designed to fit comfortably in a human hand, a probe circuit board 5 which holds the probe circuit 10 (FIGS. 2 through 2C) including circuit elements such as 8, a probe contact 6 for contacting the circuit element to be tested, and a cable 7 which connects through a probe interface (not shown) to an oscilloscope or other test instrument (not shown). FIG. 2 is a map showing how the FIGS. 2A, 2B and 2C should be arranged to show the full circuit diagram of the preferred embodiment of the test probe circuit 10 according to the invention. The electrical lines a, b, c, and d, on the right in FIG. 2A correspond to the lines a and b in FIG. 2B and the lines c and d in FIG. 2C. The electrical lines e, f, and g at the bottom of FIG. 2B correspond to the lines e, f, and g at the top of FIG. 2C. It should be understood that the particular embodiment of the invention described herein is exemplary, and is described in detail to more clearly and fully depict the invention than would otherwise be possible; it is not meant to limit the invention to this particular embodiment. The test probe circuit 10 includes an input 18 (FIG. 2A) which is electrically connected to contact 6 (FIG. 1), a probe output 30, and various power source lines 51, 21, and 23 (FIG. 2B) which connect via cable 7 (FIG. 1) to a probe interface 100 (FIG. 4) which provides power to the probe circuit 10 and passes the probe output signal to an oscilloscope 102 or test instrument. The interface 100 is shown as a separate electronic module in FIG. 4, though it also may be built in to an oscilloscope or other test instrument.

Probe circuit 10 comprises AC impedance buffer or amplifier 12, shown in FIG. 2A. The AC impedance buffer 12 provides the high frequency amplification path of the probe circuit 10 which outputs the high frequency signal to FIG. 2B on line a. The DC and low frequency path passes along line d to FIG. 2C, to a DC and low frequency impedance buffer or amplifier 11, the output of which connects to output circuit 24 in FIG. 2B via line e. Output circuit 24 shifts the level of the high frequency output signal on line a back up to a nominal zero volts and adds in the DC and low frequency components to provide the probe output signal on output 30.

Figure 3A:
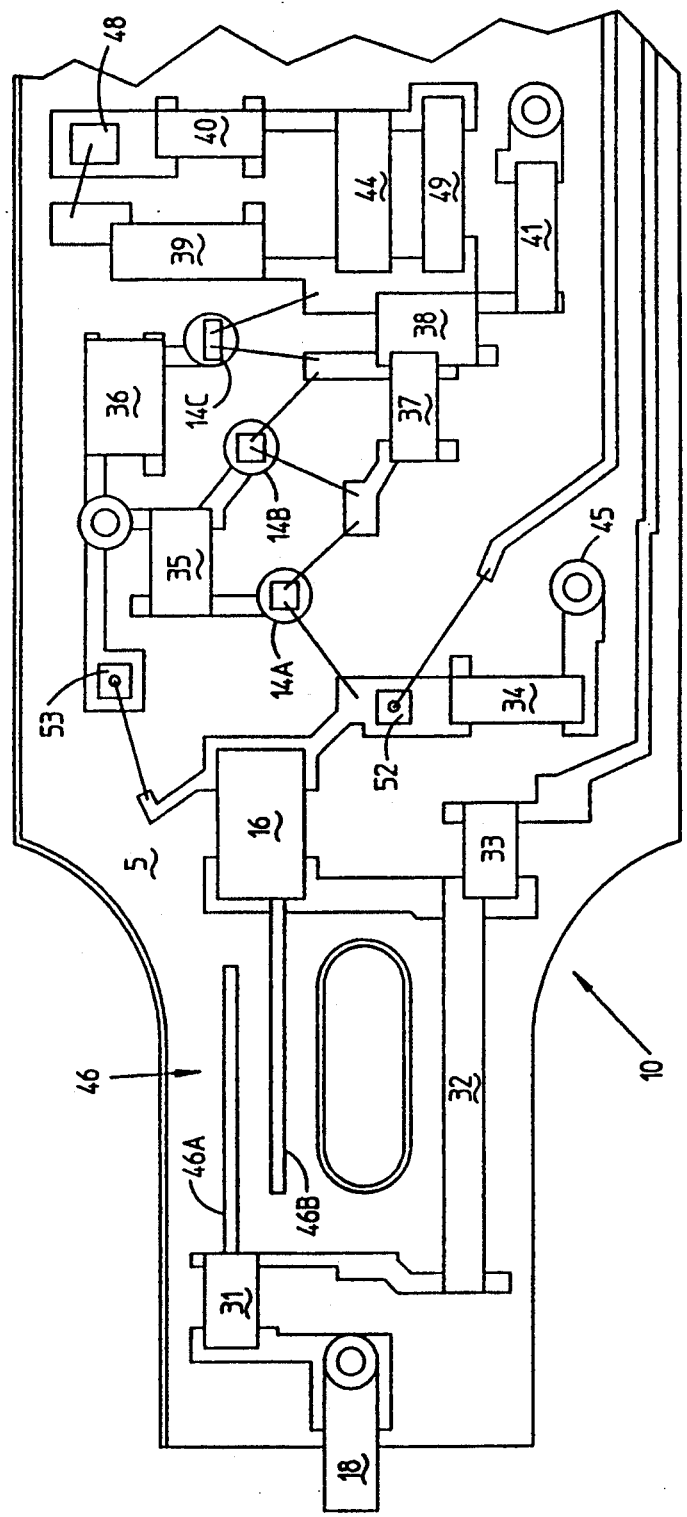
FIG. 3A and 3B show portions of the probe circuit board illustrating the physical structure of the components that are trimmed.
Figure 3B:
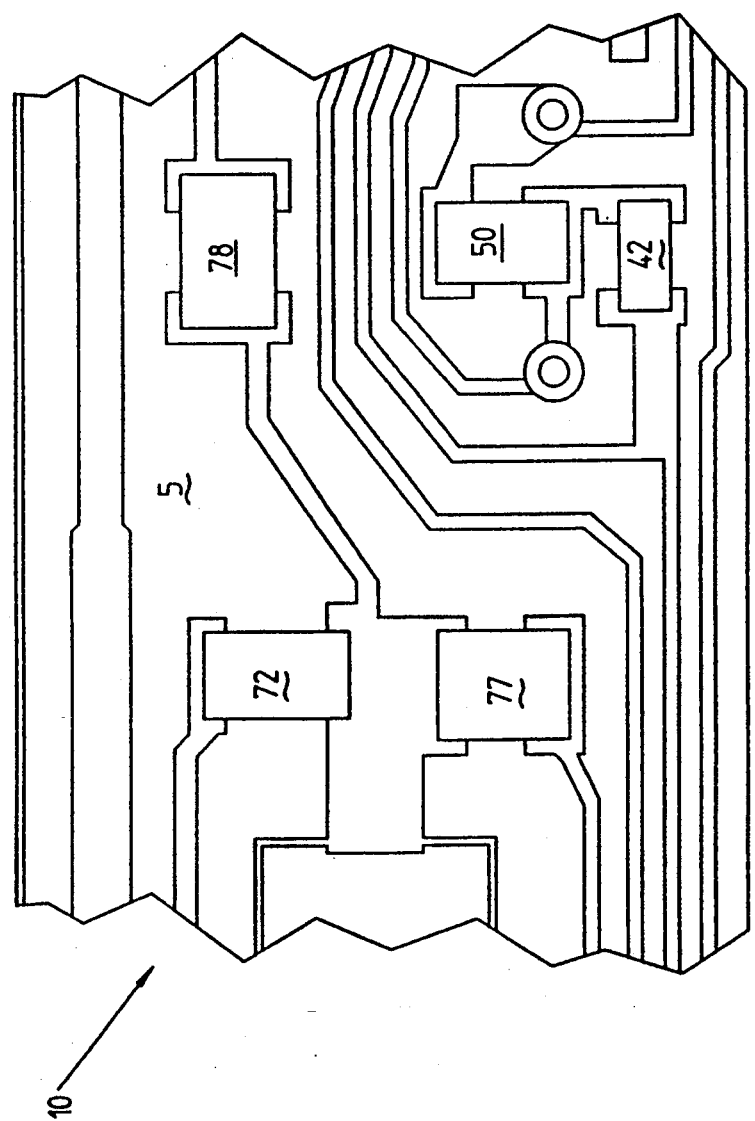

So that the probe 3 has a response that is flat to a high degree of accuracy across a wide band width, the response of the high frequency amplifier 12, the response of the low frequency amplifier 11, and the input compensation are adjusted to a high degree of accuracy. The high frequency amplifier response is adjusted by laser trimming resistor 44 (FIG. 2A), the DC and low frequency response is adjusted by trimming resistor 72 (FIG. 2C), and the input compensation is adjusted by trimming capacitor 46 (FIG. 2A). The physical structure of capacitor 46 is illustrated in FIG. 3A. It comprises a pair of interdigitized gold traces 46A and 46B on a ceramic substrate. Trace 46A is laser trimmed to adjust the capacitance. The physical structure of resistor 44 is illustrated near the right hand side of FIG. 3A, and the physical structure of resistor 72 is illustrated at the upper left in FIG. 3B; the resistors 44 and 72 are printed thick-film resistors, which are laser trimmed to adjust the high frequency and DC response, respectively. The other electronic parts of the circuit 10 shown in FIGS. 3A and 3B are labeled with the same numbers as in FIGS. 2A, 2B, and 2C. The double circles, such as 45, indicate conductive vias that pass through the circuit board 5 to make electrical contact to traces or on the other side of the board.

Figure 4:
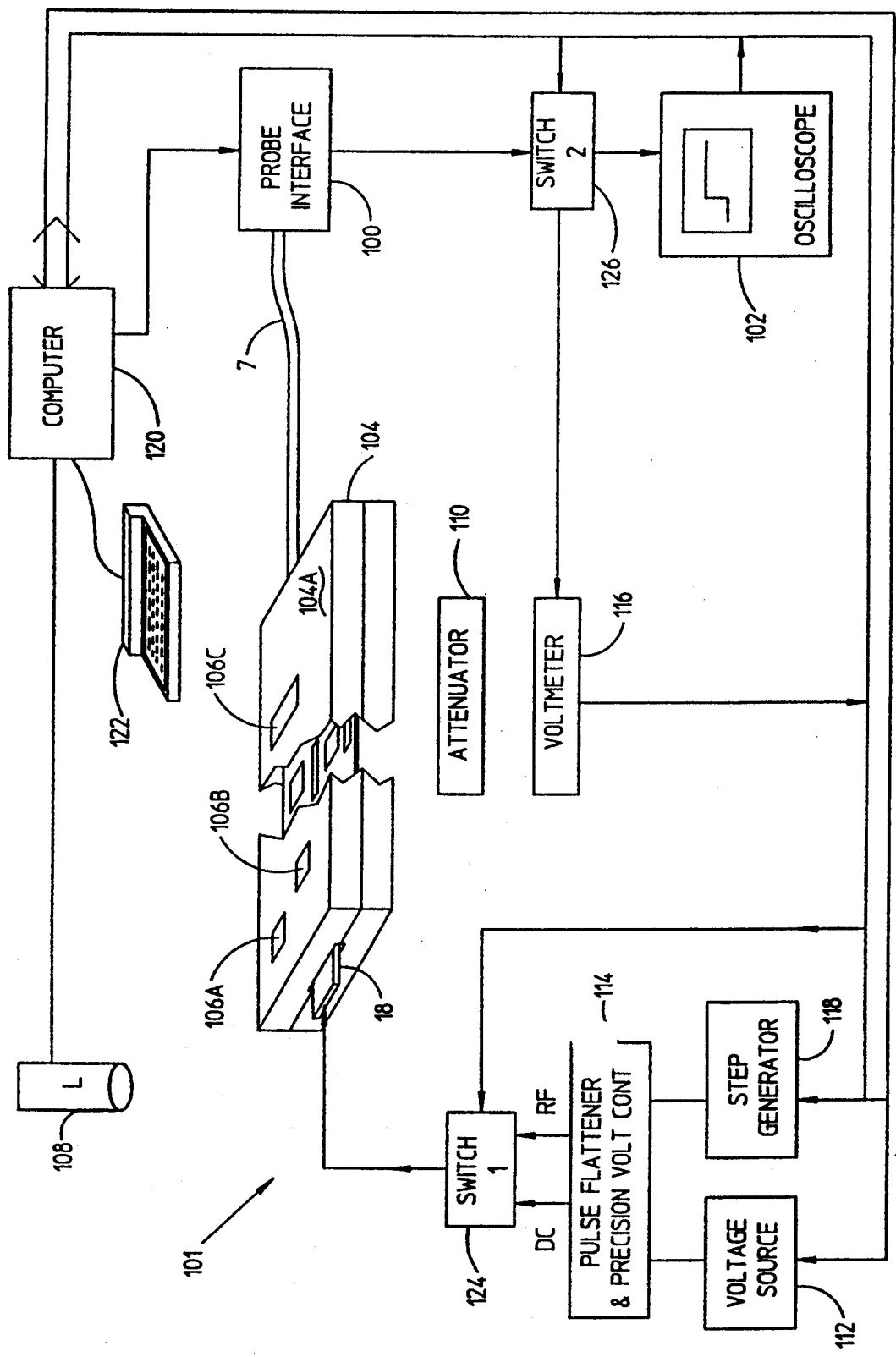
FIG. 4 is an illustration and block circuit diagram of the preferred embodiment of the automated trim apparatus according to the invention.

The trimming apparatus is illustrated in FIG. 4. The probe circuit board 5 is enclosed in a clam-shell trim enclosure 104 which simulates the influence of the probe housing 4 (FIG. 1) on the circuit 10 during the trim process. Trim enclosure 104 has ports 106A, 106B, and 106C through which the beam from laser 108 passes to perform the trim. The high frequency trim function is calibrated using attenuator 110, then a probe circuit board 5 is inserted in the clam-shell enclosure 104, power is applied to the probe circuit 10, a rough input compensation trim is performed on capacitor 46 while the probe is warming up, then the DC trim is performed on resistor 72 using voltage source 112, pulse flattener and precision voltage controller 114, and voltmeter 116, followed by the RF trim on resistor 44, and finally a fine trim of the input compensation on capacitor 46. The input compensation and RF trims are performed using step generator 118, pulse flattener and precision voltage controller 114, and oscilloscope 102. Much of the process is automatically sequenced and controlled by computer 120. Flow charts of the trim process are shown in FIGS. 6 through 12.

DETAILS OF THE PROBE CIRCUIT

Turning to FIG. 2A the test probe circuit 10 comprises transistors 14A, 14B, and 14C, capacitor 16, op amp 20, resistors 31 through 42, variable resistor 44, variable capacitor 46, capacitors 48 through 50, and diodes 52 and 53. The probe input 18 is electrically connected to the test probe contact 6 (FIG. 1) and to one side of variable capacitor 46 through resistor 31 and to the node 55, connecting the other side of variable capacitor 46 and one side of AC coupling capacitor 16, through resistor 32. The node 55 is also connected to the negative input of op amp 22 (FIG. 2C) through resistor 33. The other side of capacitor 16 is connected to the AC buffer input node 17 which is connected to the base of transistor 14A, the anode of diode 53, the cathode of diode 52, and the output of op amp 20 through resistor 34. The output of op amp 20 is also connected to its negative input through capacitor 50. The negative input of op amp 20 is also connected to +VCC thorough resistor 42 and to the AC buffer output node 56 through resistor 41. The anode of diode 52 is connected to the −VEE constant current voltage source 51. The collector 15A of transistor 14A is connected through resistor 35 to both the cathode of diode 53 and to ground 9. The emitter of transistor 14A is connected to the base of transistor 14B which is connected to its own emitter through resistor 37. The emitter of transistor 14B is also connected to the base of transistor 14C, which is connected to its own emitter through resistor 38. The collector 15B of transistor 14B is connected to ground 9, while the collector 15C of transistor 14C is connected to ground 9 through resistor 36. The emitter of transistor 14C is also connected to AC buffer output node 56. Node 56 is connected via line a to the emitter of transistor 26 (FIG. 2B) through variable resistor 44 and also through capacitor 49. Node 56 is also connected to line a through resistor 39, capacitor 48, and resistor 40 connected in series.

Turning to FIG. 2B, the probe circuit 10 also includes transistors 26 and 28, capacitors 58 through 65, and resistors 68 through 71 and 73 through 75. As indicated above, the emitter of transistor 26 is connected to the emitter of transistor 14C in FIG. 2A through variable resistor 44. The emitter of transistor 26 is also connected to the −VEE constant current voltage source 51 through resistors 68 and 69 in parallel. The node 66 connecting resistor 68 with the −VEE source 51 is connected to ground through capacitor 58, while the node 67 connecting resistor 69 to the −VEE source 51 is connected to ground through capacitor 59. The collector of transistor 26 is connected to output line 30, while its base is connected to the emitter of transistor 28, which is in turn connected to the −VEE constant current power source 51 through resistor 73. The base of transistor 26 is also connected to ground through capacitors 60 and 61 in parallel. The emitter of transistor 28 is also connected to its own collector through resistor 75, which is in turn connected to ground. The base of transistor 28 is connected to the output of op amp 22 in FIG. 2C through resistor 80 and capacitor 76 connected in parallel. The −VEE constant current voltage source 51 is connected to ground through filter capacitor 63. The +VCC voltage source is connected to ground through capacitor 64 and resistor 74 in parallel, and is also connected to ground through capacitor 62, and to the probe output 30 through resistors 70 and 71 in series. There is also a +14 volt power source which is applied solely to op amp 20 in FIG. 2A. The +14 volt power source is connected to ground through filter capacitor 65.

Turning now to FIG. 2C, the circuit 10 also includes op amp 22, transistor 98, diode 99, variable resistor 72, capacitors 76 through 79, and resistors 80 through 88. The probe output line 30 in FIG. 2B is connected via line f to the positive input of op amp 22 in FIG. 2C through resistor 81. Output line 30 is also connected via lines g and c to the positive input of op amp 20 in FIG. 2A through resistor 82 (FIG. 2C). The positive input of op amp 22 is also connected to the OFFSET line through resistor 86, to one side of variable resistor 72 through resistor 84, and the other side of variable resistor 72 through resistor 85 and capacitor 77 connected in series. The other side of variable resistor 72 is also connected to line c through capacitor 78 and resistor 87 connected in parallel and to ground. The positive input of op amp 22 is also connected to ground through capacitor 79. As indicated above, the negative input to op amp 22 is connected to the input node 55 in FIG. 2A through resistor 33 via line d, and also to ground through resistor 83. The output of op amp 22 is connected via line e to the base of transistor 28 in FIG. 2B through resistor 80 and capacitor 76 connected in parallel, as indicated above, and also the cathode of diode 99 through resistor 88. The anode of diode 99 is connected to the collector of transistor 98, which is in turn connected to its own base. The emitter of transistor 98 is connected to the −VEE constant current power source 51.

In the preferred embodiment, transistors 14A and 14B are AT-60200 NPN transistors, transistors 14C and 26 are AT-42000 NPN transistors, transistors 28 and 98 are 3904 transistors, op amp 22 is an AD OP-27 op amp having a GBW of greater than 5 MHz and an offset of less than 100 $\mu$V, op amp 20 is an AD 548 op amp having a GBW of greater than 0.8 MHz and an offset of less than 2 mv, diodes 52 and 53 are 5082-0001 pin diodes, and diode 99 is a 5.1 volt Zener diode. Variable resistors 44 and 72 are preferably printed thick film resistors, preferably made of a Dupont TM 1700 series resistor paste on a ceramic substrate. Both are preferably about 0.5 mils thick. Resistor 44 is preferably about 43 mils long and 24 mils wide. As will be discussed in detail below, it is active trimmed to set the RF gain of the probe to match the DC gain, preferably within a half percent; it has a nominal target value of 28.8 ohms. Variable resistor 72 is preferably about 50 mils long by 40 mils wide. As will be discussed below, it is active trimmed to set the DC accuracy of the probe to ±0.5%; it preferably has a nominal target value of 396.7 ohms minus the resistance of resistor 84, or 25.2 ohms. Variable capacitor 46 is made of a pair of interdigitized gold traces 46A and 46B on a ceramic substrate. Each trace is about 0.4 mils thick, 8 mils wide, and 100 mils long. The gap between them is about 8 mils wide. As will be discussed more fully below, preferably trace 46A is active trimmed to set the input compensation of the probe to match the RF gain to within 0.5%. Capacitors 16, 48, 49, 50, 58, 59, 60, 61, 62, 63, 64, 65, 76, 77, 78 and 79 have capacitances of 200 pf, 1.8 pf, 1.5 pf, 3.3 nf, 10 nf, 10 nf, 680 pf, 680 pf, 47 nf, 1 $\mu$f, 22 $\mu$f, 1.5 $\mu$f, 10 nf, 6.8 nf, 3.3 nf, and 3.3 pf respectively, and resistors 31, 32, 33, 34, 35, 36, 37, 38, 39, 40, 41, 42, 68, 69, 70, 71, 73, 74, 75, 80, 81, 82, 83, 84, 85, 86, 87, and 88 have resistances of 183 ohms, 89.8 kohms, 9.6 kohms, 600 kohms, 100 ohms, 60 ohms, 450 ohms, 170 ohms, 220 ohms, 145 ohms, 600 kohms, 400 kohms, 80 ohms, 80 ohms, 10 ohms, 90 ohms, 1 kohm, 100 ohms, 3 kohms, 3 kohms, 9.6 kohms, 600 kohms, 400 ohms, 371.5 ohms, 14 kohms, 16.7 kohms, 400 kohms, and 250 ohms respectively.

The probe circuit 10 functions as follows. Capacitor 16 provides AC coupling and DC isolation between the input 18 and the high frequency AC impedance buffer 12. The three bipolar transistors 14A, 14B, and 14C in emitter follower configuration provide an input impedance buffer and the high frequency amplification path. The output of the three emitter followers is fed to output transistor 26 (FIG. 2B) via AC buffer output node 56. DC impedance buffer 11 (FIG. 2C) provides the DC and low frequency amplification path. The low frequency signals pass from input 18 to the negative input of op amp 22 via line d. The positive input of op amp 22 is connected to the probe output 30. In this manner op amp 22 provides a DC and low frequency signal to output transistor 26 which ensures that probe output 30 follows the signal on input 18. Transistor 26 is configured as a common base amplifier. In this configuration, output transistor 26 adds together the high frequency output from input stage 12 and the DC and low frequency output from op amp 22 to provide the output signal on probe output 30. Output transistor 26 also shifts the negative voltage bias of the AC impedance buffer 12 back up to a nominally zero voltage and provides a gain of about 1.1. Finally, output circuit 24 also provides an output impedance buffer for op amp 22. That is, op amp 22 has an output impedance of zero ohms. However, the probe specification calls for an output impedance of 100 ohms to optimize tradeoffs between power consumption and dynamic range. This 100 ohm impedance is provided primarily by resistors 70 and 71. Transistor 28 provides additional buffering between op amp 22 and transistor 26 so that the high frequency performance of transistor 26 is not affected by op amp 22.

Op amp 20 biases the AC buffer input node 17 to a negative voltage as compared to input node 55, which negative voltage is preferably minus 3.6 V when node 55 is at zero volts. Since node 17 is negative, collectors 15A, 15B, and 15C may be connected to ground and the emitter followers 14A, 14B, and 14 C will function properly since their collectors are at a higher voltage than their bases. Since the collectors are grounded, no bypass to ground is required. Resistors 37 and 38 provide a self-biasing network to minimize parasitic loading and optimize the input resistance. The positive input of op amp 20 is connected to the output 30 (FIG. 2B) and the negative input is connected to the AC buffer output node 56. As a result, op amp 20 also adjusts the bias on AC buffer input node 17 so that the AC buffer output node 56 follows the probe output 30, though at a different bias level, at DC and low frequencies. Since probe output 30 follows input 18 at DC and low frequencies due to the action of op amp 22, op amp 20 thus causes the AC buffer output node 56 to follow input 18 at DC and low frequencies. Thus the two op amps 20 and 22 together comprise a DC signal follower means for causing the AC buffer input node 17 to follow the DC and low frequency signals on the probe input 18. Since at high frequencies node 56 is coupled to input 18 through capacitor 16 and node 17, the node 56 follows the input 18 at all frequencies. Adding in the DC and low frequencies through op amp 20 prevents shifts in output signal level due to, for example, large AC spikes on top of a large DC change. Resistors 34, 41, and 42 and capacitor 50 adjust the bias and gain of op amp 20 to maintain the appropriate negative bias on nodes 17 and 56. Resistors 34 and 41 are both very high resistance values, the first to yield the high input impedance, and the second to provide the appropriate large voltage drop needed to bias node 56 to a negative voltage. A +14 volt power source is used to power op amp 20 because of the high impedance of resistor 34.

Returning to FIG. 2A, the RC circuits 90, 91, and 92 are "cable compensation networks", that is they provide gain to compensate for the loss in gain due to the cable connecting the probe to the test instrument. This loss is a function of frequency, so several different networks are provided to offset the loss within different frequency ranges. The network 90 comprising variable capacitor 46 and resistor 32 provides a gain boost in a range about the 10 megahertz frequency, the network 91 comprising resistors 39 and 40, variable resistor 44, and capacitor 48 provides a gain boost in a range about the 100 megahertz frequency, and the network 92 comprising capacitor 49 and variable resistor 44 provide a gain boost in a range about the 1.5 gigahertz frequency. Capacitor 79 (FIG. 2C) provides a gain boost to compensate for cable loss in a range about the 1 megahertz frequency.

The −VEE constant current source 51 voltage is nominally −10 volts. The constant current source 51 protects the trace electronics from being over driven, for example from too large a voltage at input 18. Too much current in the probe circuits can damage the semiconductors. The prior art generally used voltage clamping circuits to provide such protection. The constant current source 51 provides the protection without such bulky clamping circuits. Since the power to op amps 20 and 22 is limited by the constant current source, and through the op amps, the power to the other parts of the circuit, such as the impedance buffer circuit 12 is also limited, the constant current power source −VEE limits the current drawn by the circuit 10 as a whole. Diodes 52 and 53 provide further over-voltage protection. Normally both diodes are off. If the voltage on node 17 becomes higher than about +0.7 volts, diode 53 will turn on and if the voltage on node 17 becomes less than about −11 volts, diode 52 will turn on, thus keeping the base of transistor 14A within a prescribed voltage range.

Turning to FIG. 2B, the capacitors 58 through 65 are bypass capacitors. Resistors 68, 69, 70, 71, and 72 adjust the bias of the nodes to which they connect, and resistors 70 and 71 also set the gain of transistor 26. Resistor 70 is a temperature compensated resistor which adjusts the gain of the bipolar amplifiers, i.e circuits 12 and 24, for temperature shifts.

Turning to FIG. 2C, the circuit comprised of resistors 80 and 88, capacitor 76, Zener diode 99, and transistor 98 is a protective circuit which prevents the output of op amp 22 from over driving transistors 26 and 28. Resistors 81 and 82 and resistor 33 in FIG. 2A control the gain on the inputs of the op amps to which they connect. Resistor 85 and capacitor 77 provide a gain correction factor for op amp 22 that corrects for gain shifts with frequency in the circuit composed of resistor 83 and capacitor 16 and resistors 32, 33 and 34 in FIG. 2A. That is, as the frequency goes up, capacitor 16 begins to look like a short between the resistors 32 and 33 and resistor 34. This places the resistors 83 and 33 in parallel with the resistance of resistor 34 and the input resistance of amplifier 12 and thus lowers the gain of the low frequency amplifier loop. The circuit composed of resistor 85 and capacitor 77 increases the gain of the low frequency amplifier loop within its frequency range of up to 500 KHz to compensate. Resistors 81, 83, 84, 72, and 33 (FIG. 2A) set the gain of op amp 22. Resistors 82, 87, and 41 (FIG. 2A) set the gain of op amp 20. Capacitors 78 and 50 (FIG. 2A) control the frequency response of op amp 20; that is, these capacitors cause op amp to roll off at high frequencies so that it does not affect the high frequency response of node 17.

The op amps 20 and 22 provide an additional function that enables the three emitter follower bipolar high frequency circuit to be successfully used in the probe. Bipolar transistors heat up and their physical parameters change when a pulse passed through them. Then as they gradually cool, they change back to their original parameters. This cooling creates a non-linear, low frequency thermal tail on their output. The op amps 20 and 22 take this low temperature tail out of the response. Further, the op amps are very stable with temperature, thus do not add any other extraneous instability into the low frequency response.

THE TRIM APPARATUS AND PROCESS

The wide band width of the probe just described includes two separate amplification circuits that feed back into one another. Further the circuit has many components the performance of which varies with temperature. In addition the overall capacitance of the circuit, and specifically the input compensation, depends on the specific probe structure; that is, small variances in the trace thicknesses and positions, and the placement of discrete components, can strongly alter the input compensation within the trim specifications. It was also found that the circuit was so sensitive that its performance differed when it was enclosed by the probe housing 4 and when it was not. Laser trims cannot be performed while the circuit is in its housing, however, mechanical trims or trims in which fixed components were added or removed from the circuit are not sensitive enough to accurately trim the circuit. All these factors made accurate trim of the circuit 10 a difficult problem.

Moreover, the circuit operating range has a very high frequency end, and absolute high frequency measurements are not possible. That is, to measure an absolute voltage of 150 millivolts on the output of a 10:1 attenuator, the input would have to be a flat 1.5 volts. However, a flat AC voltage is extremely difficult to obtain.

The solution was to iteratively trim in three circuit regions, the DC region 11, the AC region 12, and the input compensation region 90, and in three distinct time regions, the DC region, the 80 nsec or middle frequency region, and the 3 ns or high frequency region. An absolute DC trim of the DC amplifier 11 is performed by trimming resistor 72 using a precision voltage source and a high precision voltmeter. Preferably the input voltage is 2.5 volts and, since the probe circuit 10 has an attenuation of 10:1, the output voltage should be 250 millivolts. Then the middle and high frequency trims are calibrated to the absolute DC measurement. This is done by sending a step voltage (FIG. 5A) through a precision standard attenuator with the same attenuation as the desired attenuation of the probe, and measuring the difference in the voltage between the step at 80 nsec and 1.4 $\mu$sec and the difference in voltage between the step at 3 nsec and 80 nsec. The step at 1.4 $\mu$sec is essentially DC. If the probe is then substituted for the standard attenuator, the same step voltage is run through it, and the circuit trimmed so that the voltage difference between 80 nsec and 1.4 $\mu$sec and the voltage difference between 3 nsec and 80 nsec are the same as they were for the standard attenuator, we now know that the response of the probe then matches that of the standard attenuator. The AC amplifier 12 cuts in at about 500 KHertz so this part of the circuit is dominant at the 80 nsec point, and the 80 nsec point is used to trim resistor 44 which tunes the AC amplifier circuit 12. The input compensation region cuts in at about 10 Megahertz so this aspect of the circuit is dominant at the 3 nsec point, and the 3 nsec point is used to trim capacitor 46 which adjusts the input compensation.

Figure 5A:
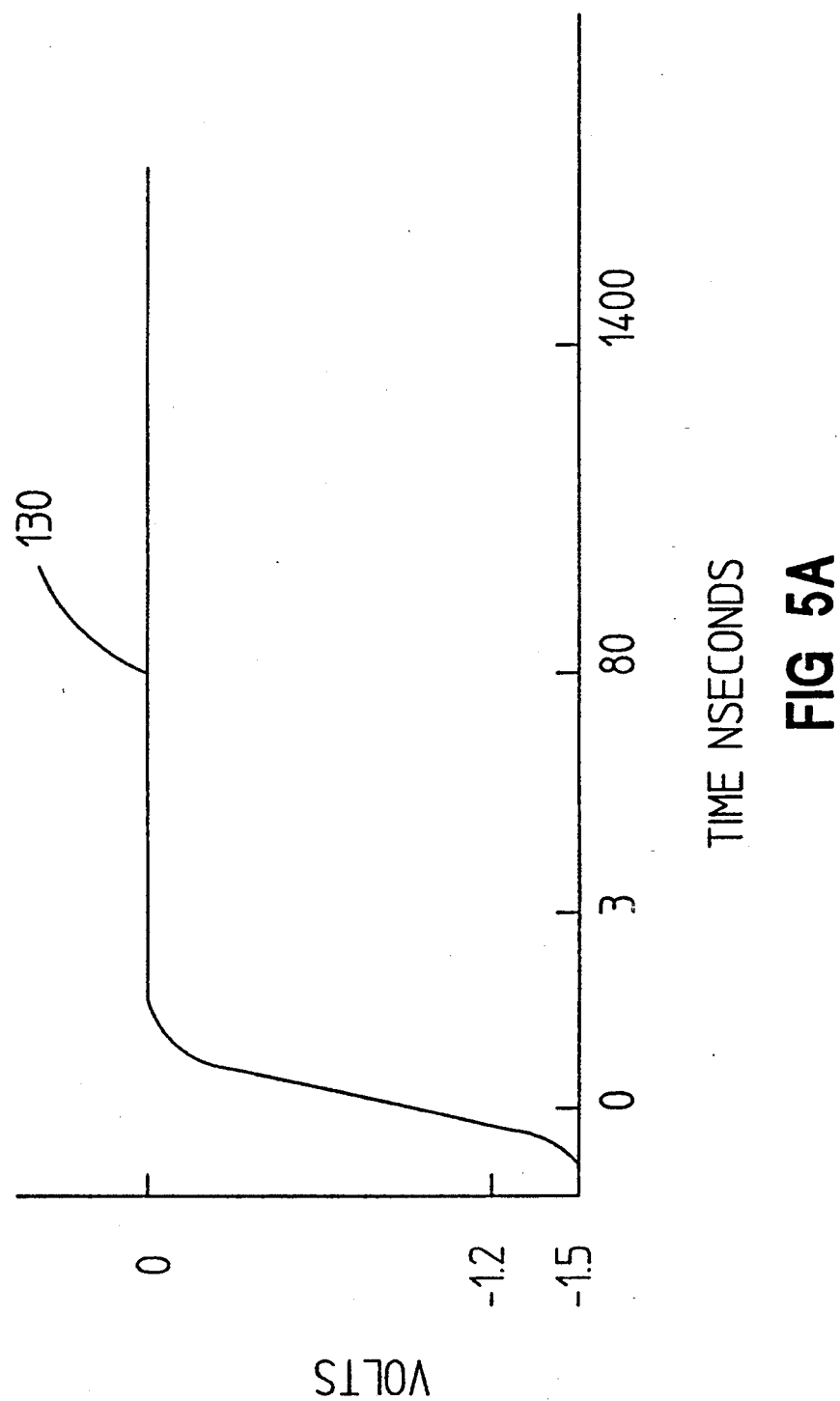
FIG. 5A is an illustration of the step pulse that is used to calibrate the RF measurements to the DC measurements and to trim the RF portions of the circuit.

An averaging oscilloscope is used to perform the RF measurements. Preferably, the HP 54121 oscilloscope and the V time function as defined in the oscilloscope manual is used. A 1.5 volt step as shown in FIG. 5A is used. Preferably, the step has a 500 picosecond rise time and a 3 μsec period. This pulse is obtained by use of probe flattener 114, which includes a rise time converter. The probe circuit 10 has a 10:1 attenuation factor, and thus the voltage on output 30 will be a nominal 150 millivolt step. The 20% rise mark, or the −120 millivolt point, is called the "zero" time point, and measurements are taken at 3 nsec, 80 nsec, and 1.4 μsec from this point. Preferably, a V time function taking an average of 2048 voltage measurements at each point, is used.

The iteration is performed in the following manner. First capacitor 46 is rough trimmed using the step voltage and the oscilloscope 102. Then the DC trim is made on resistor 72 using the DC voltage output by pulse flattener and precision voltage controller 114 and voltmeter 116. Then the resistor 44 is trimmed using the step voltage and the oscilloscope 102. Then a fine trim on capacitor 46 is performed using the step voltage and the oscilloscope 102.

Figure 5B:
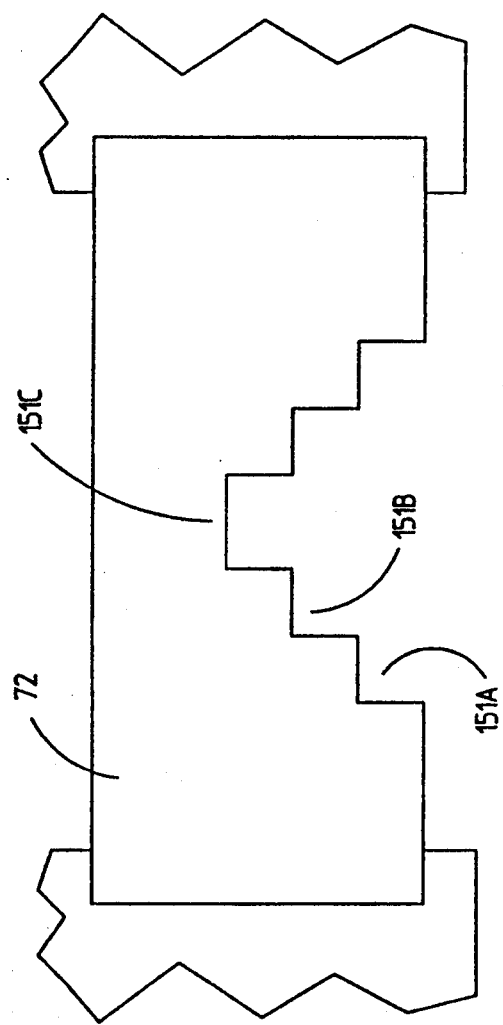
FIG. 5B is an illustration of a step scan type laser trim.
Figure 5C:
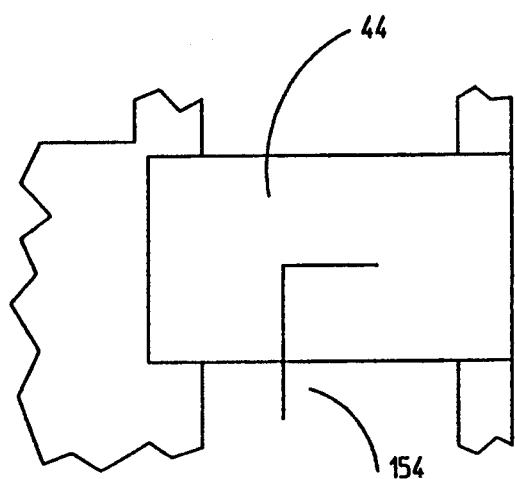
FIG. 5C is an illustration of an L-cut type laser trim.

The input compensation trim on capacitor 46 is preferably performed by cutting off the distal end of finger 46A. Since this finger is attached to the input 18 the trim done to this finger also reduces the input capacitance, which is preferable. The DC trim on resistor 72 is utilizing a step scan cut. A typical step scan cut is shown in FIG. 5B. In this cut the laser is first moved into the side of the resistor (the vertical direction in FIG. 5B). This direction is perpendicular to the axis of current flow in the resistor. After moving in a distance approximately equal to the width of the cut, or kerf of the laser beam, the laser is activated and moved along the length of the resistor (the horizontal direction in FIG. 5B), which is parallel to the axis of current flow, cutting out a piece of the resistor 151A as wide as the kerf. For the next cut, the laser it is moved horizontally slightly closer to the center line of the resistor and further into the resistor along the vertical direction in FIG. 5B approximately a distance equal to the kerf width, then activated and moved parallel to the axis of current flow a distance slightly short of where it stopped in the first cut, cutting out a second piece 151B of the resistor as wide as the kerf. And so on to remove a slightly shorter piece 151C in a third cut. This results in what looks like a series of steps 151A, 151B, 151C etc. The high frequency trim on resistor 44 is performed by making L-shaped cuts in the resistor 44. A typical L-cut is shown in FIG. 5C. This style cut is made by nibbling small "dots" of resistor material to form the L-shape. First the nibbles are made in the vertical direction in FIG. 5C along the line 154 which is perpendicular to the current flow axis. The resistance increases geometrically with such cuts perpendicular to the current axis. After each nibble or dot removed the output of the probe circuit 10 is measured, and when the output reaches within a specified percentage of the target value of the voltage as measured on oscilloscope 102, the cut is turned to go parallel with the current flow axis, that is along the horizontal direction in FIG. 5C. The resistance increases only very slowly with cuts in this direction. The cut continues in this direction, taking off smaller and smaller dots as the target value is approached, thus making smaller and smaller trims.

Turning to FIG. 4, the active trim apparatus is shown. It comprises a probe interface 100, an oscilloscope 102, clam shell enclosure 104, a laser 108, a standard attenuator 110, a voltage source 112, a step generator 118, a pulse flattener and precision voltage controller 114, a voltmeter 116, a computer 120 having an input means 122, such as a keyboard, and two electronically activated switches 124 and 126. To do a trim, the probe circuit board 5 is inserted in the clam-shell enclosure 104 and the enclosure is closed thereby causing input 18 to contact a contact that connects to the output of switch 124. Probe power is delivered to the probe circuit 10 via interface box 100 through cable 7. The clam-shell enclosure is designed to simulate the housing 4 that the probe circuit board will be enclosed in after the trim; that is, the enclosure 104 is tuned so that the electronic performance of the probe circuit 10 within the enclosure 104 precisely duplicates the performance within the probe housing 4. Clam-shell enclosure 104 has ports 106A, 106B, and 106C in the upper portion 104A. Port 106A is located over capacitor 46 (FIG. 3A), port 106B is located over resistor 44, and port 106C is located over resistor 72, so that the beam from laser 108 can reach the respective components to perform the trim. Cable 7 connects to computer 120 and switch 126 via interface 100. Switch 126 is connected to the computer 120, the output of attenuator 110, the input of voltmeter 116, and the input of oscilloscope 102. The output of oscilloscope 102 connects to computer 120, as does the output of voltmeter 116. Computer 120 also connects to laser 108, keyboard 122, step generator 118, voltage source 112, and switch 124. The outputs of step generator 118 and voltage source 112 connect to pulse flattener and precision voltage controller 114. The pulse flattener and precision voltage controller 114 has an DC and RF output, both of which connect to switch 124. The output of switch 124 connects to probe input 18.

Preferably laser 108 is a YAG laser, computer 120 is a DEC TM personal computer, attenuator 110 is an Hewlett Packard HP33340C 20 db (10:1) passive attenuator having a DC to 26.5 gigahertz response, voltmeter 116 is a Hewlett Packard HP3458 high precision digital voltmeter, oscilloscope 102 is a Hewlett packard HP54121 oscilloscope, step generator is a Hewlett Packard HP8131A pulse generator, voltage source 112 is a 10 volt source of raw DC voltage, pulse flattener and precision voltage control is an Hewlett Packard ET38153, although any other equivalent electronic devices may be used. Switches 124 may be any electronic switch or switches with a suitable number of poles and throws and suitable RF response.

Figure 6:
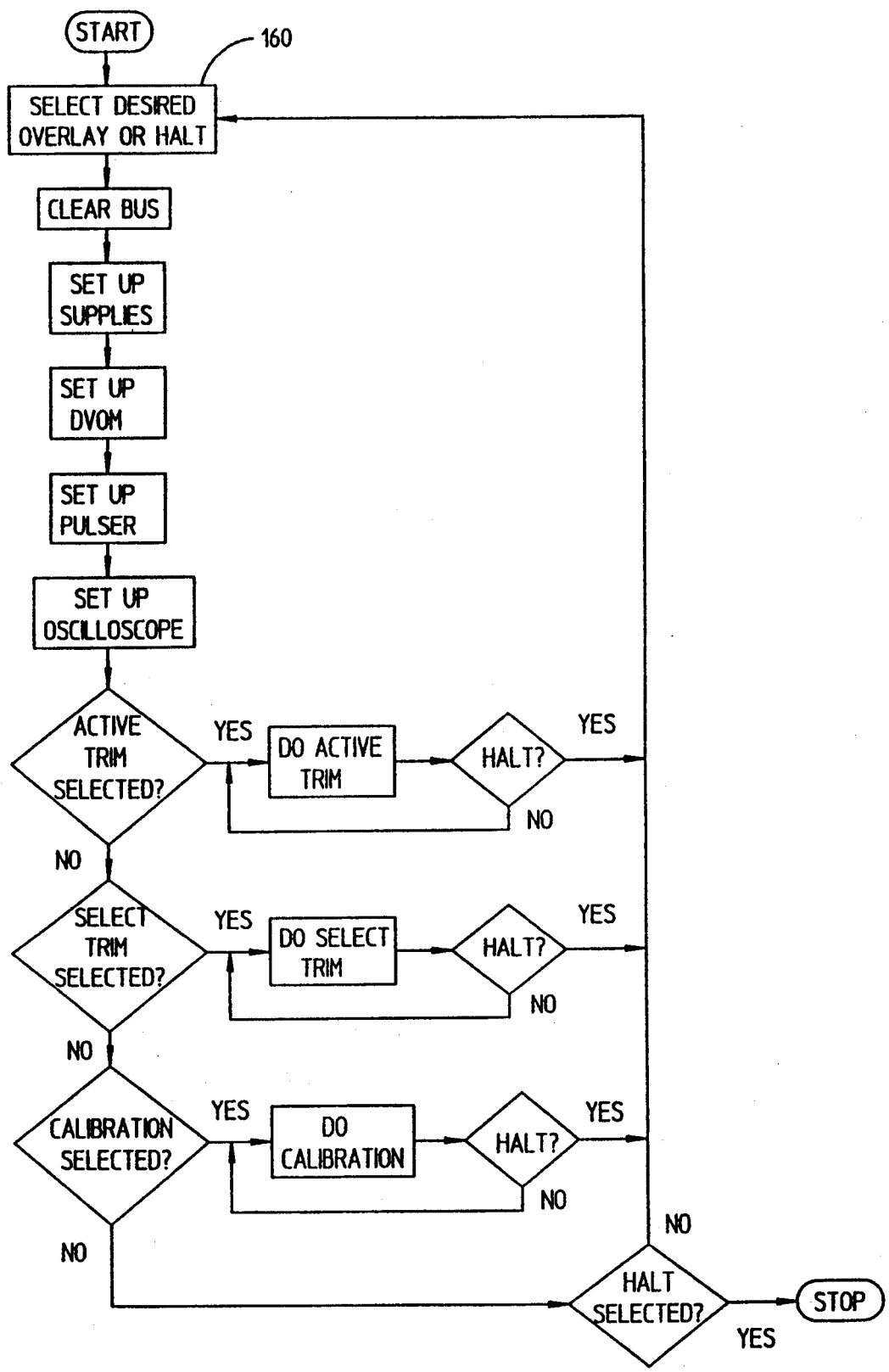
FIG. 6 is a flow chart showing an the overall scheme of the preferred embodiment of the calibration and trim process according to the invention.

Turning to FIG. 6, the overall flow of the calibration and trim process according to the invention is shown. The flow chart describes a program in computer 120, although, as will be seen below, at various points the program will pause and wait for the operator to either perform a manual function, or permit the operator to manually control the program through keyboard 122. As soon as the program is entered, it requests that the user select the desired program overlay or subprogram or halt the program. After the user selects one of the overlays or halt, the computer clears the various busses in the system, and sets up the system according to default values, in response to a user input, allows the user to set up the system according to user-selected parameters. Values are entered to set up the power supplies, the digital voltmeter 116, the pulser, i.e. the step generator 118 and pulse flattener and precision voltage controller 114, and the oscilloscope 102. If the user has selected the "active trim" overlay, the system goes to the active trim subprogram shown in FIGS. 8A through 12 below; If the user has selected the "select trim" overlay, the program pauses and allows the user to manually control the trim process through keyboard 122; If the user has selected the "calibration overlay" the system goes to the calibration subprograms shown in FIGS. 7A and 7B below; If the user selects "halt" the program immediately terminates. The select trim alternative is a manual mode that is used, generally only by an experienced operator, to trouble shoot problems or to manually do a custom trim. For example, if there was a system failure at a time when the trim on a probe was nearly completed, an experienced operator may chose to manually complete the trim instead of proceeding through the entire trim process.

Figure 7A:
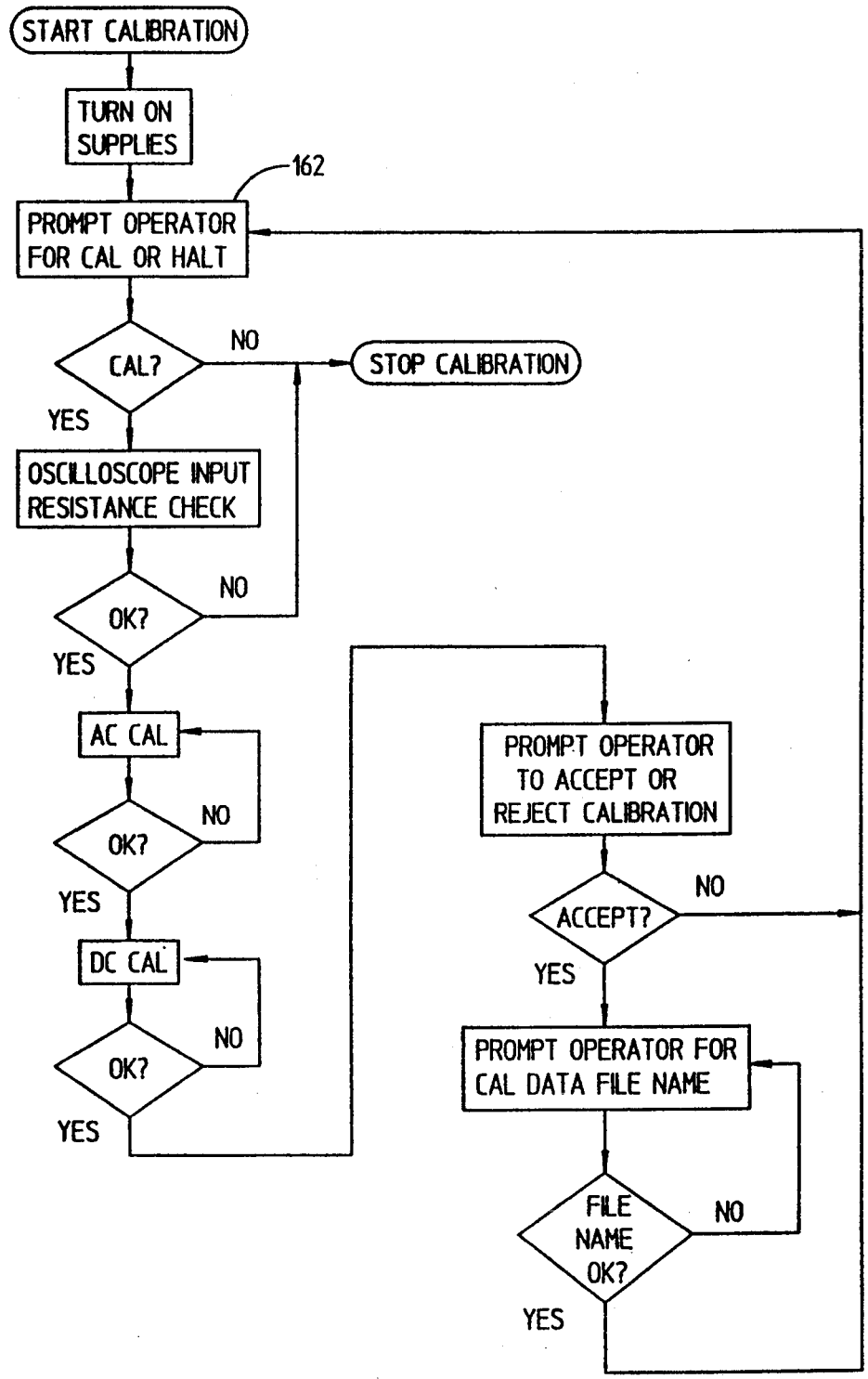
FIG. 7A is a flow chart of the preferred embodiment of the calibration process indicated in the flow chart of FIG. 6.
Figure 7B:
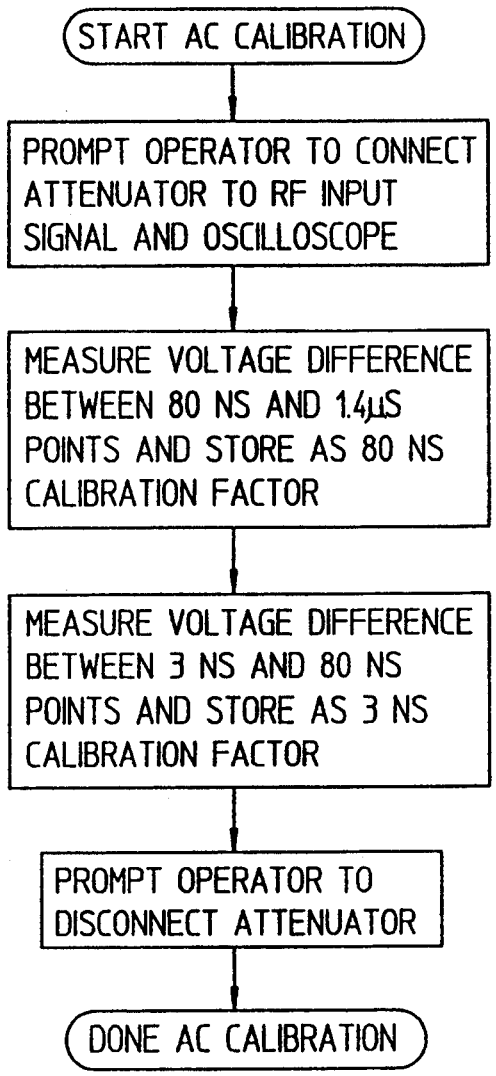
FIG. 7B is a flow chart of the preferred embodiment of the AC calibration process indicated in the flow chart of FIG. 7A.

The calibration process is performed each time the trim apparatus 101 is turned on, and generally does not have to be repeated unless the apparatus 101 is turned off. The system may be left on for long periods, in which case the calibration process may be performed only at infrequent intervals. The calibration subprograms are shown in FIGS. 7A and 7B. If the calibration subprogram is selected, the calibration subprogram is started and the power supplies are turned on. When the power supplies first come on, it may be immediately evident that they are not set up properly, so the as soon as they are turned on, the operator is prompted to either calibrate or halt, or continue the calibration. If the user selects to halt calibration the program terminates the calibration subprogram and returns to step 160 in FIG. 6. If the user selects to continue calibration, the oscilloscope input resistance is checked. If the input resistance is not within a necessary specification, the program terminates, since the oscilloscope needs to be sent out for repair. If the input resistance is within the specification, the AC calibration is performed.

Turning to FIG. 7B, a flow chart of the preferred AC calibration steps is shown. Following this flow chart with reference to FIG. 4, first attenuator 110 is connected by the user-operator to the RF input signal and to oscilloscope 102. Then the step generator 118 outputs the step pulses and the V time function is used to measure the difference in the voltage output by attenuator 110 at the 80 nsec point and at the 1.4 μsec point. This voltage difference is stored as the 80 nsec calibration factor. Then the V time function is used to measure the difference in the voltage output by attenuator 110 at the 3 nsec point and at the 80 nsec point. This voltage difference is stored as the 3 nsec calibration factor. Then the attenuator 110 is disconnected from the trim circuit 101. The program then returns to the main calibration subprogram in FIG. 7A. If the AC calibration does not check out o.k., the program returns to the AC calibration subprogram and repeats the calibration until it does check out o.k. Then it performs the dc calibration. This is essentially a one-step calibration in which the output of dc source 114 through the attenuator 110 is measured and recorded. This result becomes the target for the dc trim. If the dc calibration does not check out o.k., it is repeated until it does. The operator is then prompted to accept or reject the calibration. If it is rejected, the subprogram returns to point 162 and the operator has the choice to repeat or terminate calibration. If the calibration is accepted, the operator is prompted to select a calibration data file name. The name selected is checked to be sure it is a valid one and is not the same as a previous file in the system, and the operator is prompted to select another name if the one selected was not o.k. When a proper name is selected, the data is stored under that file name and the subprogram returns to point 162 to allow the operator to repeat the calibration of halt.

Figure 8A:
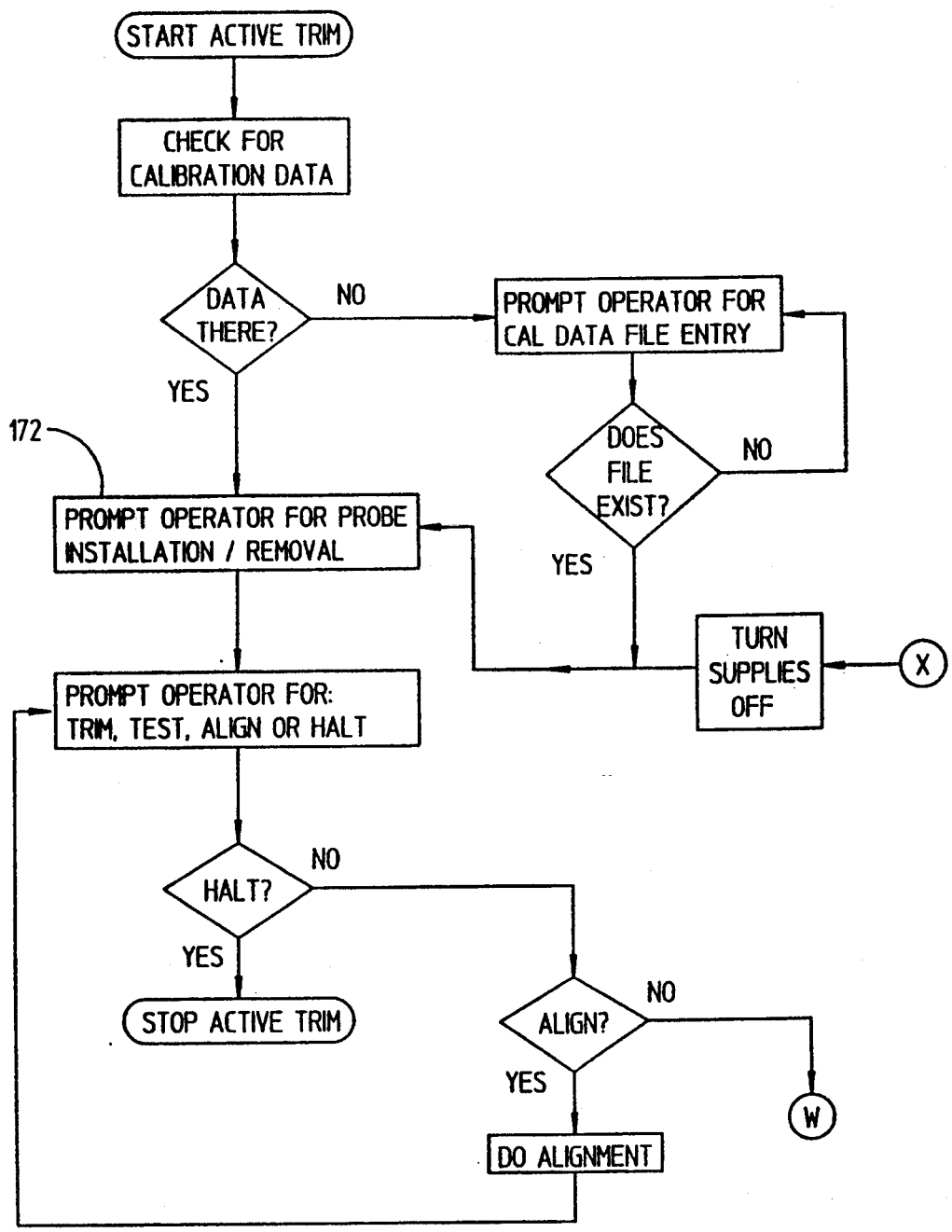
FIGS. 8A through 8C are a flow chart of the preferred embodiment of the active trim process indicated in the flow chart of FIG. 6.
Figure 8B:
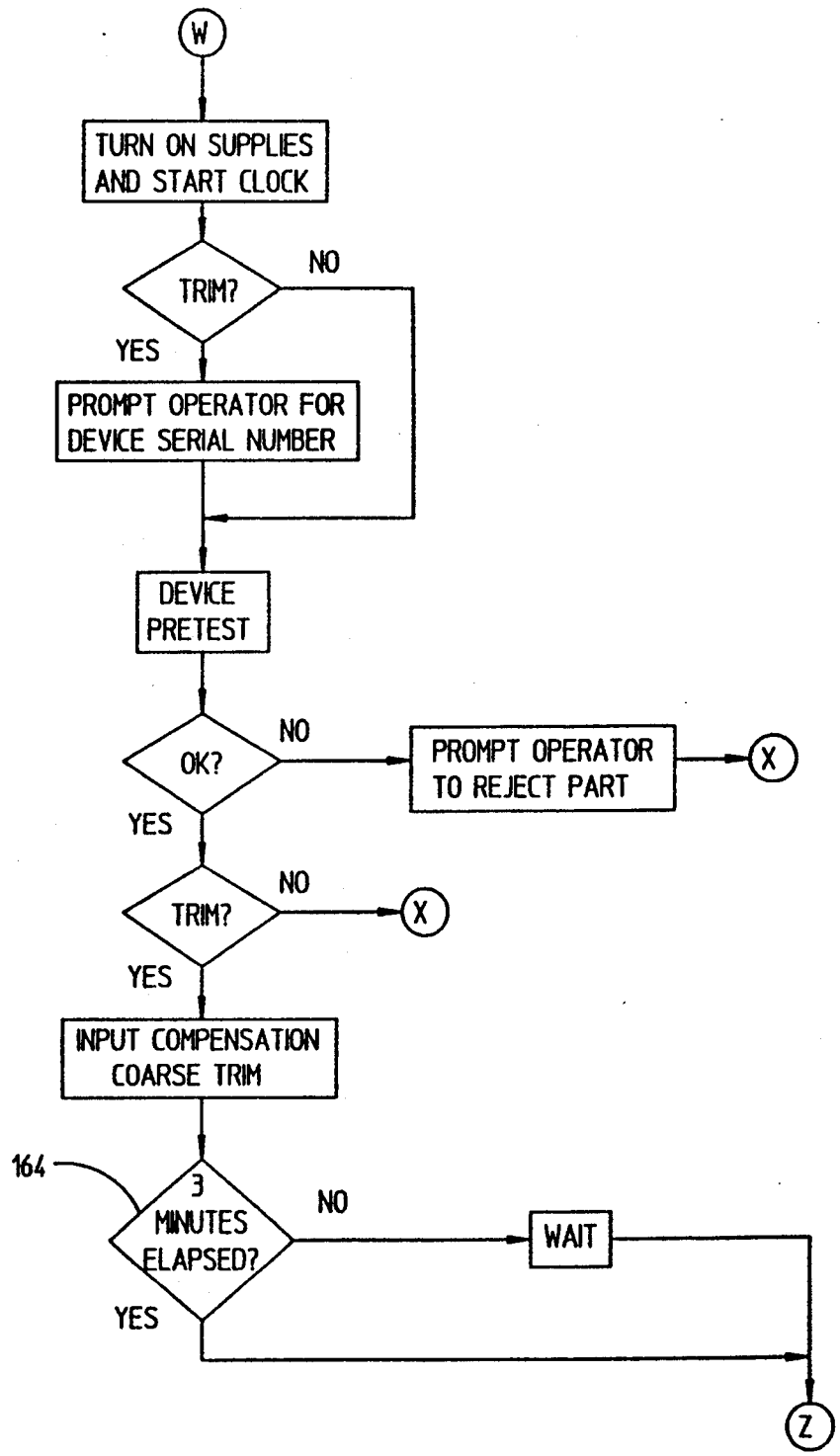
Figure 9A:
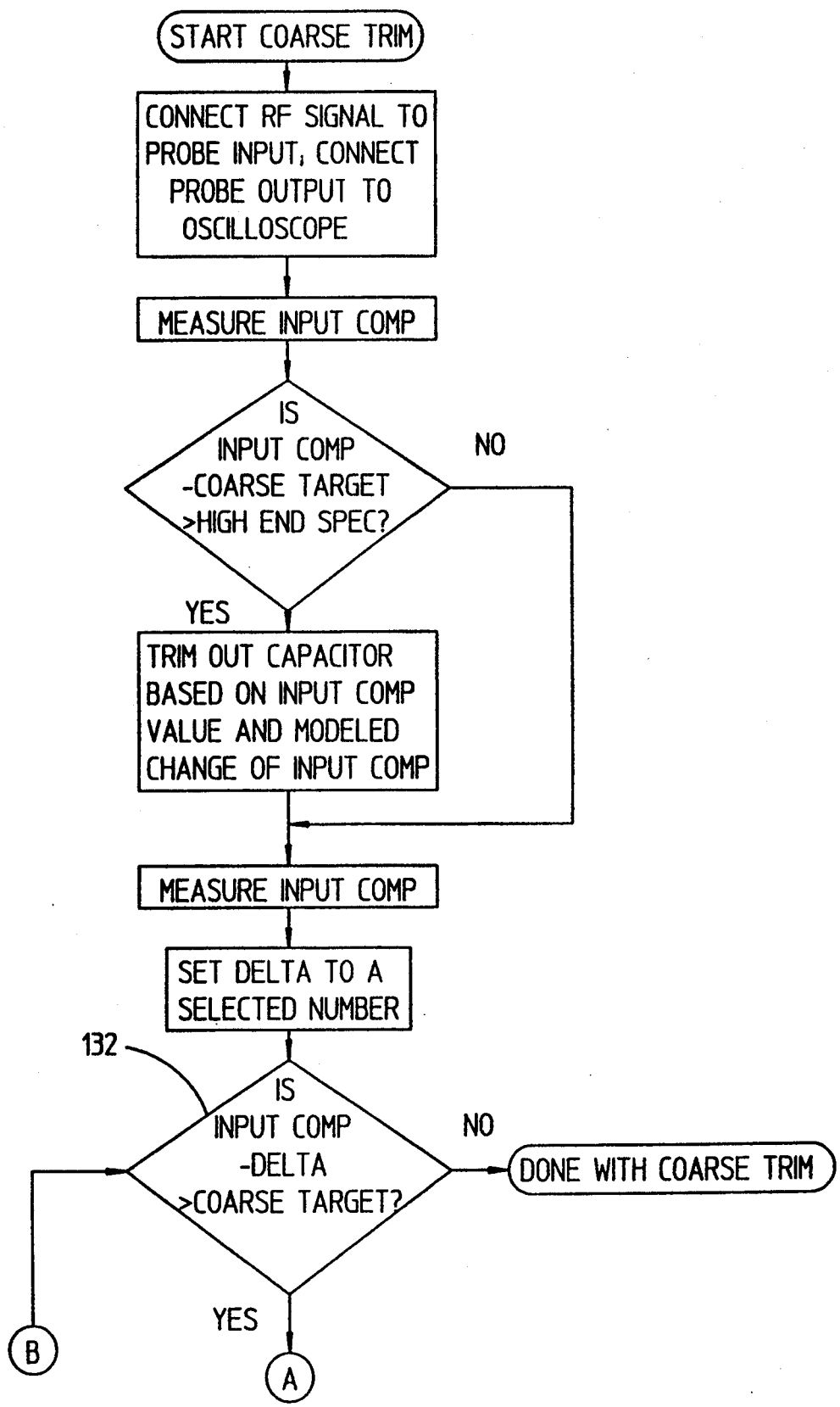
FIGS. 9A and 9B are a flow chart of the preferred embodiment of coarse input compensation trim processes indicated in the flow chart of FIG. 8B.
Figure 9B:
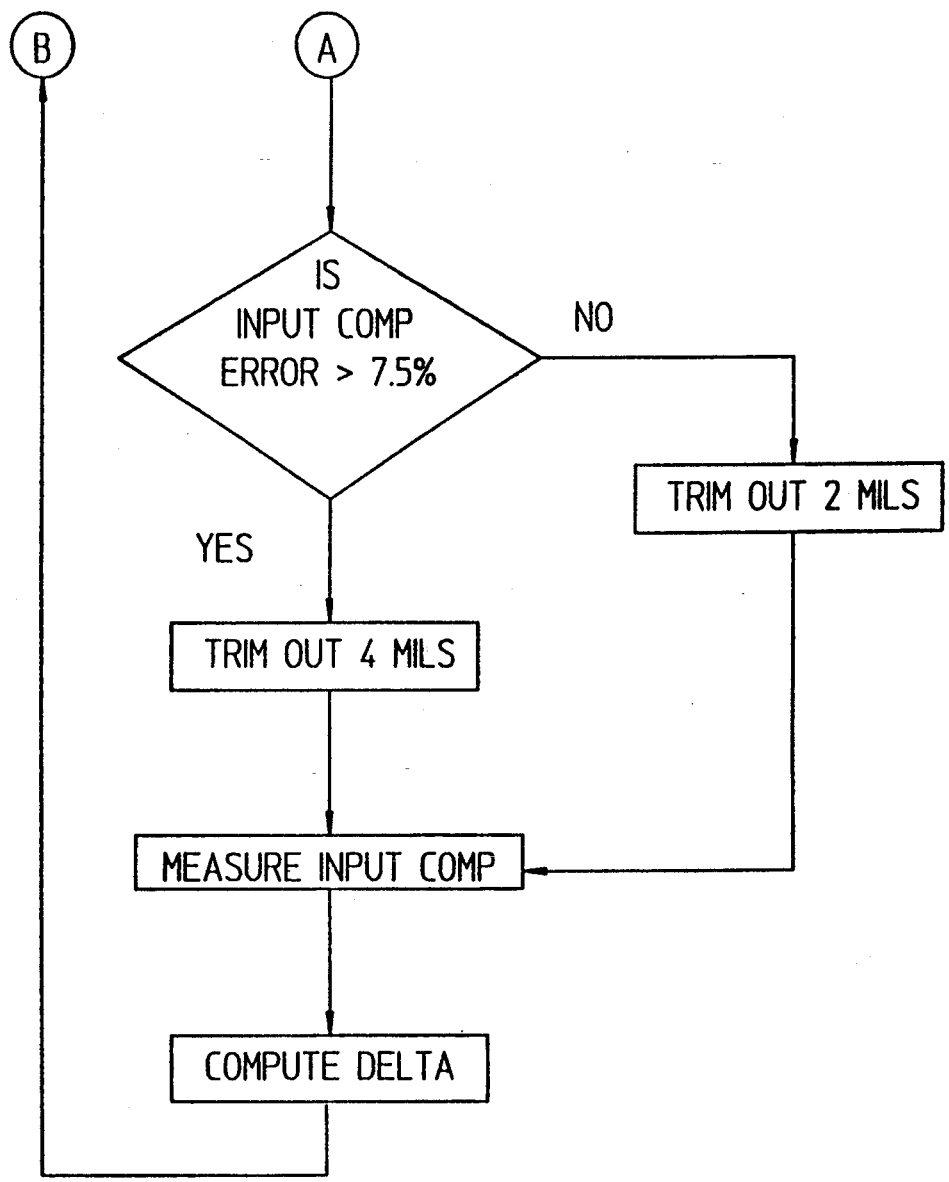

If the "active trim" overlay is selected in the main program (FIG. 6), the system enters the active trim subprogram shown in FIG. 8A. First the subprogram checks for the presence of calibration data. If it is not present, the operator is prompted to enter the name of a calibration data file. If the file entered does not exist, the prompt is repeated until a valid calibration data file name is entered. Once the calibration data is available, the operator is prompted to either install or remove a probe. Since this is the beginning of the active trim program, using a mechanical feed, the operator inserts a probe circuit board 5 into the housing 104 (FIG. 4) and closes the top 104A making contact with the input 18. The operator connects the cable 7 to interface 100. The operator is then prompted to trim, test align, or halt the process or continue. If the process is halted, the program returns to point 160 in the main program of FIG. 6. If alignment is selected, the probe circuit board 5 is aligned properly to do the trims. The alignment is then checked, and if it is not correct it is realigned until alignment is proper. The subprogram of FIG. 8B is then entered at "W". Power is applied and a software clock in computer 120 is started. If the operator has previously selected "trim", the program prompts for the serial number of the probe circuit board 5. When the serial number is entered, a pre-trim checklist is gone through. These pre-trim checks include checking if the proper voltages appear at the output when voltages are applied to the input. For example, the input compensation output voltage, the high frequency gain voltage, and the DC gain voltage should all be within a specified voltage window. Voltages are also applied to the OFFSET line 89 and the output 30 is checked to see if the appropriate voltages result. If the pre-trim checks are not o.k., the operator is prompted to reject the part, and when the reject has been recorded, the program returns to the program of FIG. 8A at point "X". The power supplies to the part are turned off, and the operator is prompted to remove the part. The part is placed in a rework bin (not shown) or scrap bin depending on the errors; for example if the input compensation, high frequency gain, or DC gain voltages are higher than the prescribed window, the part would be placed in the rework bin, and if too low, they would be scrapped. The operator then inserts a new part and starts again. If the pre-trim checks are o.k. (FIG. 8B), and if "trim" has previously been selected, the input compensation coarse trim subprogram in FIG. 9A is entered, otherwise the test is terminated and the program returns to the program of FIG. 8A via point "X".

At the start of the input compensation coarse trim, computer 120 switches switch 124 (FIG. 4) to connect the RF signal to the probe input 18 and switches switch 126 to connect the probe output 30 to oscilloscope 102, if they are not already so connected. The input compensation value is measured; this means that the voltage difference between the 3 nsec point and the 80 nsec point on pulse 130 (FIG. 5) is measured. The initial value of the input compensation voltage value will generally be 50% to 60% higher than the desired voltage value, i.e. the 3 nsec calibration voltage value. The program checks to see if the measured input compensation voltage minus a predetermined coarse target is greater than the high end specification voltage. This coarse target is preferably about 3% above the 3 nsec calibration voltage. The high end specification voltage is some specified percentage of the calibration voltage defining the higher of the tolerances on the calibration voltage. If the input compensation is greater than the high end specification voltage, then the capacitor 46 is trimmed based on the measured input compensation value and the modeled change of input compensation. That is, the amount that the input compensation voltage will change for a given amount trimmed off the capacitor electrode 46A is modeled in the program, and the program selects an amount to be trimmed that will reach reasonably close to the course target without exceeding it. If the input compensation minus the course target is not greater than the high end specification voltage, then the value of the input compensation is too close to the target value to do this first coarse trim, and this step is skipped. The input compensation is measured again. A value delta is defined which is equal to the difference between measured input compensation voltage before an individual trim cut is done and the value immediately after the trim cut is done. That is, delta is equal to the amount that the input compensation voltage changed with the last cut. The idea behind the cutting scheme is to continue making a particular size cut until another cut the same size would reduce the input compensation below the target value. Then a smaller cut is made. In this way the trim approaches the target value much more quickly than if cuts of all one size were made. Before the first cut is made there is no measured value of delta, so the computer selects a number that is roughly equal to what the first value of delta should be. This is known from experience of trimming a few circuits 10 and will vary with the particularities of the manufacturing process. If the input compensation voltage minus delta is greater than the target value, then the program goes to the flow chart shown in FIG. 7B. First the program checks to see if the measured input compensation error is within 7.5% of the desired voltage, that is whether the measured input compensation is more than 7.5% greater than the 3 nsec calibration voltage; if so, then a cut taking 4 mils off the distal end of electrode 46A is made. If the measured input compensation is within 7.5% of the calibration voltage, then only 2 mils is trimmed out. The 7.5% value, the coarse target, and the value of delta are chosen so that usually the first cut in this loop will be a 4 mil cut, which will take the input compensation error to just under 7.5% and the next cuts will be 2 mils cuts. That is, in the case of this trim, and the other three trims described below, the parameters are chosen so that the trim will quickly approach the desired voltage when it is far from the voltage, and then approaches the desired voltage more slowly as it gets closer. This greatly lessens the time it takes to make a complete trim, It may occasionally turn out that the first cut in the loop takes the input compensation error to about 7.6%, in which case, the next cut will be another 4 mil cut. This second 4 mil cut will generally get the input compensation error close enough to the coarse target so that no further cuts are needed. Whatever the results, the program will continue cycling through loop "A" (FIG. 9B) and decision tree 132 (FIG. 9A) as many times as it takes to get within a 2 mil (or, rarely, 4 mil) cut of the coarse target. The coarse input compensation trim is then complete, and the subprogram returns to FIG. 8B at point 164. The program checks to see if three minutes has elapsed since the part was powered up. This three minute warm up period is required to properly do the dc gain trim, which is the next step. When three minutes has elapsed, the program proceeds to the next portion of the trim subprogram in FIG. 8C entering at the point "Z", and proceeds to the dc gain trim subprogram.

Figure 10:
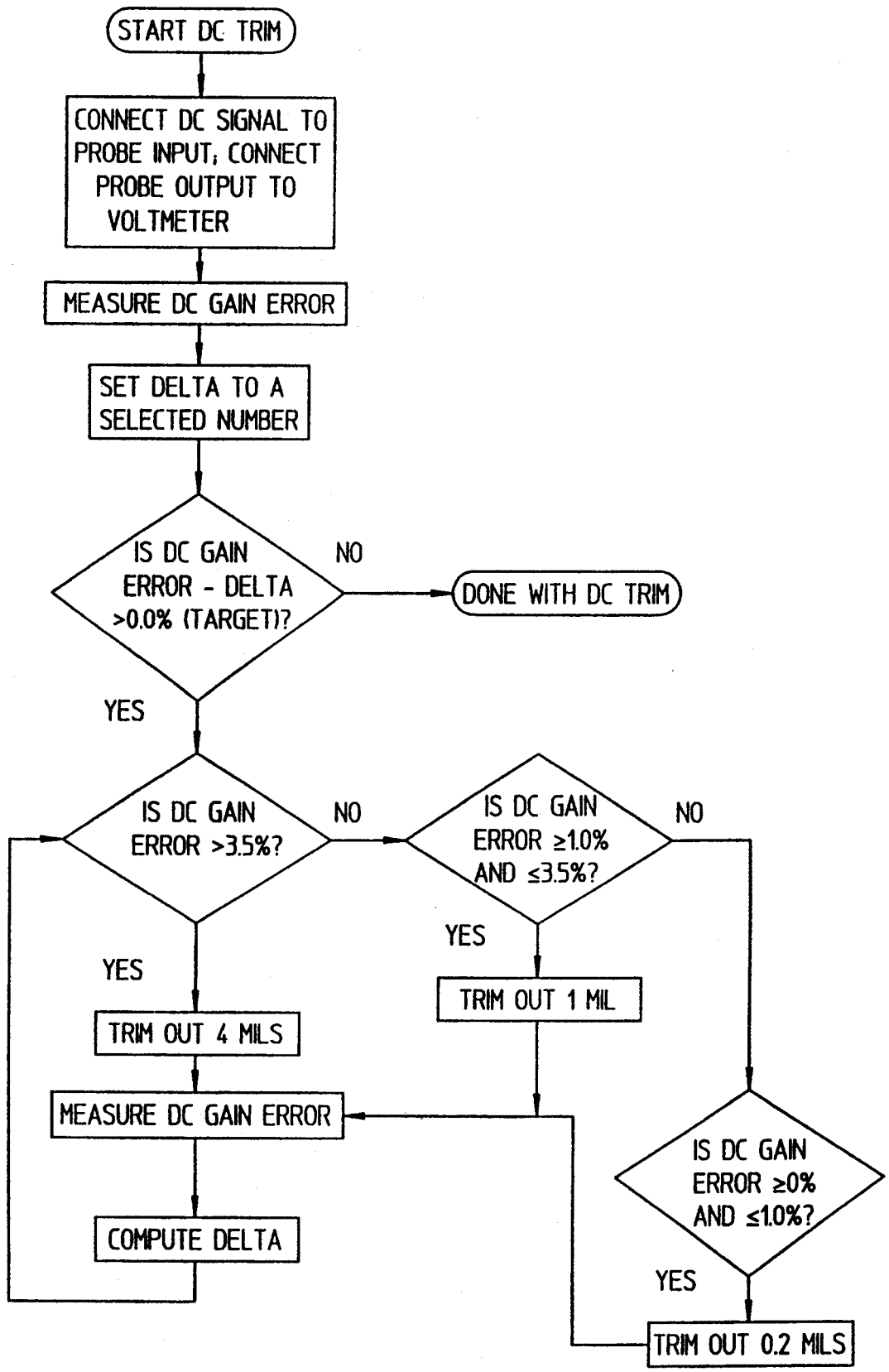
FIG. 10 is a flow chart of the preferred embodiment of the dc gain trim process indicated in the flow chart of FIG. 8C; process indicated in the flow chart of FIG. 8C.

The DC gain trim subprogram steps are shown in FIG. 10. First the computer connects the DC signal output by pulse flattener and precision voltage controller 114 to the probe input 18 via switch 124 and connects the probe output to voltmeter 116 via switch 126. Then the DC gain error is measured. That is the desired DC voltage on output 30 is subtracted from the measured DC voltage on output 30. Again a delta is defined which is equal to the difference between the previously measured DC gain error prior to the last cut, and the DC gain error immediately after the last cut. That is, delta is the voltage change caused by the last cut. Again, before an cut is made, there is no delta that can be measured, so the computer selects a value close to what experience shows the first value of delta will be. If the measured DC gain error is within delta of the target voltage, that is the desired output DC voltage, then the DC trim is done. However, delta is selected so that generally this will not be the case prior to any trim, and the program then checks to see if the measured DC gain error is within 3.5% of the target voltage. If it is not, then a cut that is 4 mils thick in the direction perpendicular to the direction of current is trimmed off of resistor 72 with a step scan type trim as discussed above in connection with FIG. 5B. However, If the DC gain error is between 3.5% of the target voltage and 1% of the target voltage, then the program does a 1 mil trim step scan type trim rather than a 4 mil trim. If the DC gain error is below 1% of the target voltage, and then a 0.2 mil scan-type cut is done. After any cut, the program again measures the DC gain error, and if another cut like the previous one will take the voltage below the target voltage, the trim is done. However, the 3.5%, 1%, and trim sizes of 4 mils, 1 mil, and 0.2 mils are chosen so that generally the trim will proceed in an orderly fashion from 4 mil trims to 1 mil trims to 0.2 mil trims. When the dc trim is done, the program then returns to the trim subprogram in FIG. 8C at point 166. The dc trim is checked, and if it is not o.k., the probe is then checked against specification, then the operator is prompted to reject the part and the program reenters the active trim program at point "X" in FIG. 8A. Depending upon how the part checked against specifications, the part is removed and placed in the rework or scrap bin. The operator then either inserts a new part or halts the trim program. If the dc trim checks out properly, then the subprogram goes on to the high frequency gain trim.

Figure 11A:
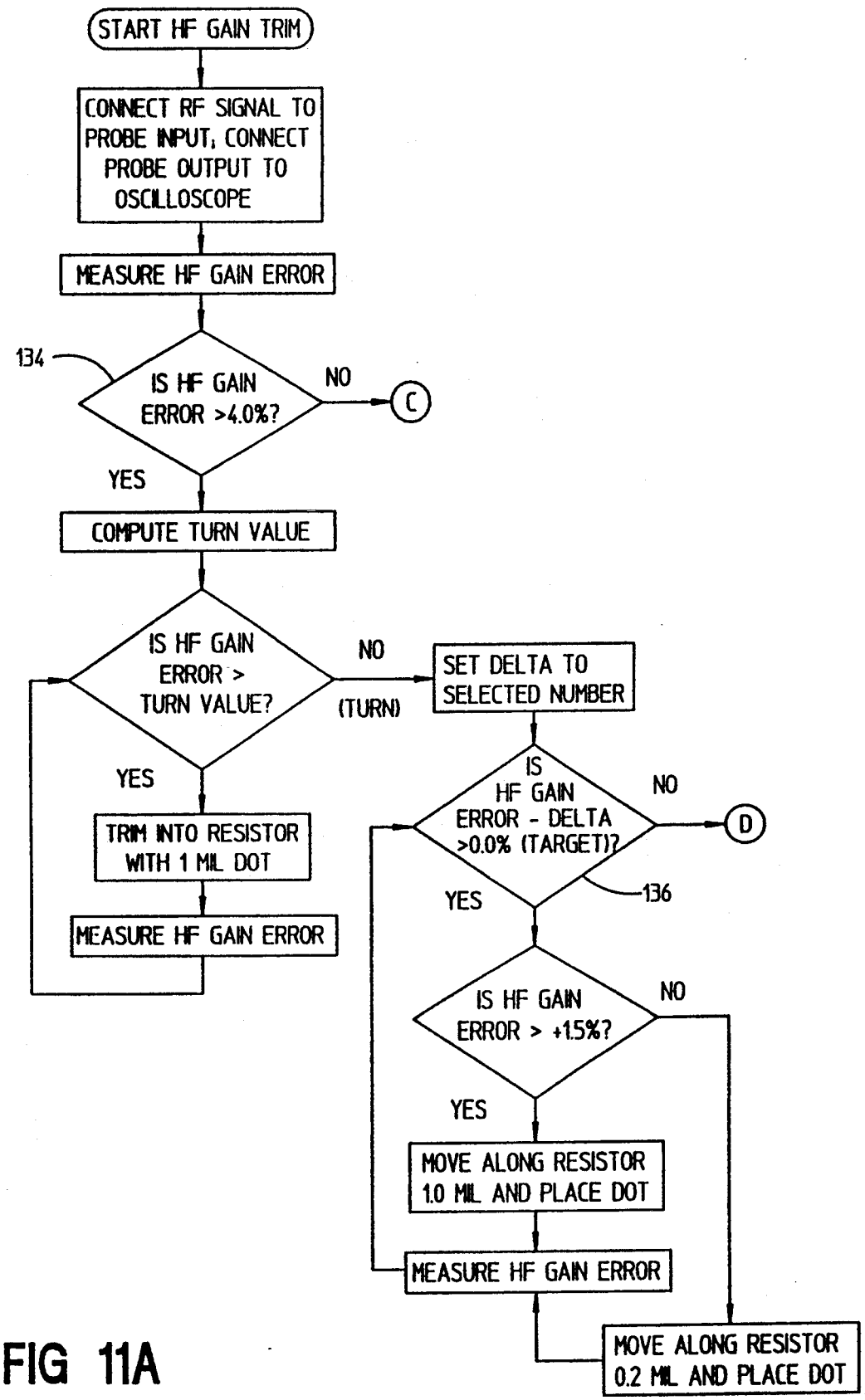
Figure 11B:
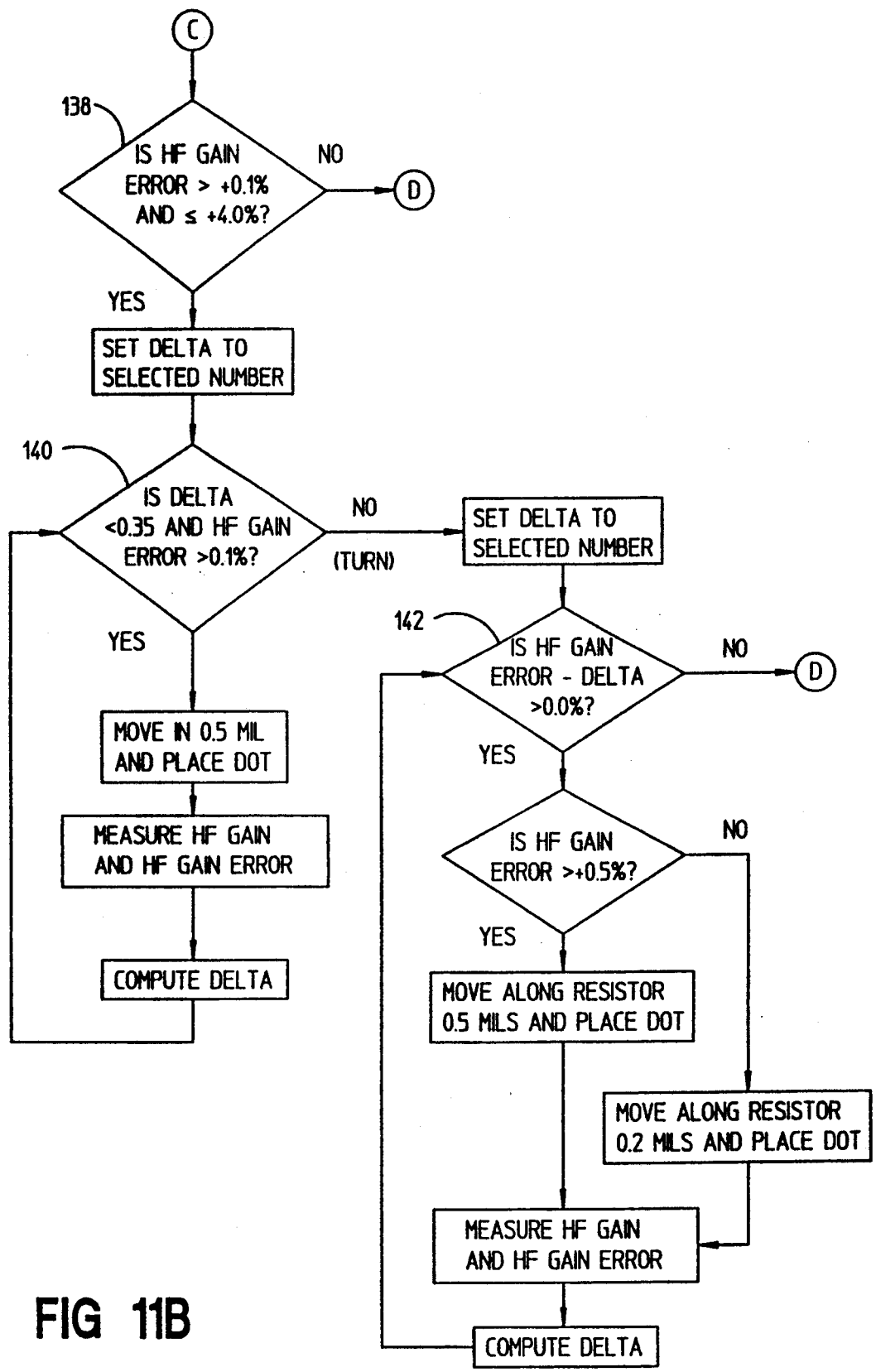
Figure 11C:
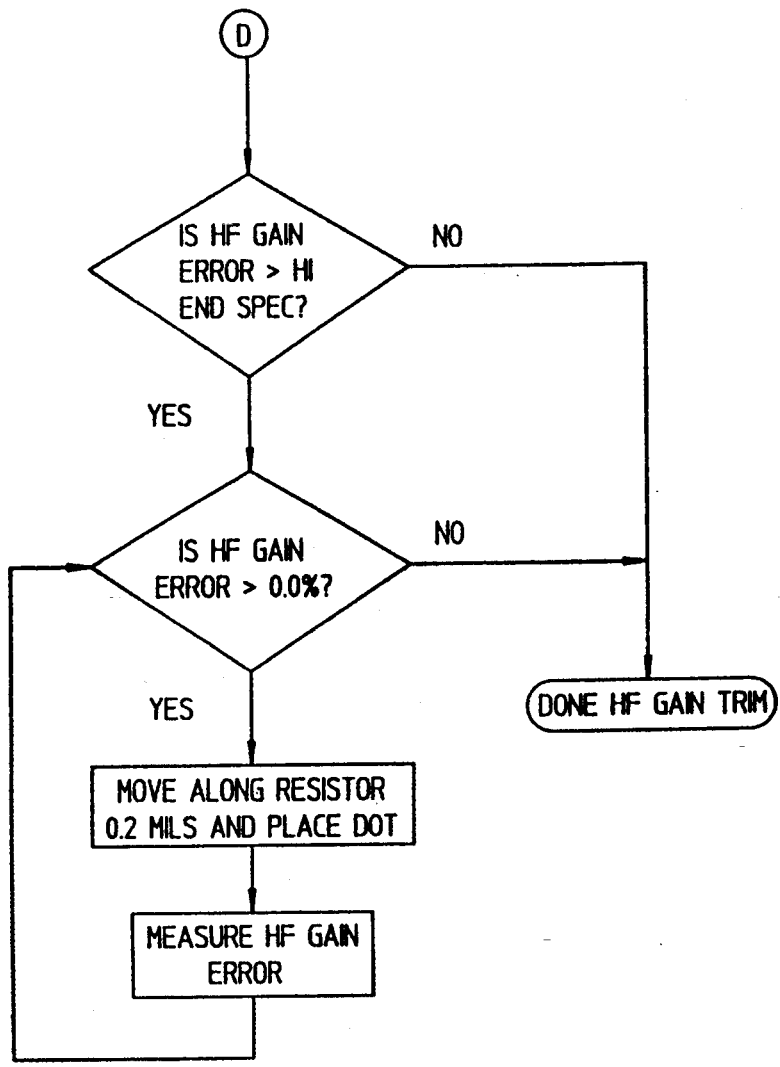

The flow chart for the high frequency gain trim is shown in FIGS. 11A through 11C. First the computer 120 reconnects the probe input to the RF signal output by pulse flattener and precision voltage controller 124 and the probe output to oscilloscope 102 via switches 124 and 126, respectively. Then the high frequency gain error is measured. The high frequency gain voltage is the voltage difference between the 80 nsec point and the 1.4 $\mu$sec point on pulse 130 (FIG. 5), and the high frequency gain error is the difference between the high frequency gain voltage and the 80 nsec calibration voltage. Thus the high frequency gain error measurement tells how far the probe output voltage is away from the desired 80 nsec voltage. All cuts in the high frequency trim are L-type cuts as described above in connection with FIG. 5C. If the high frequency gain error is greater than 4% of the desired output voltage, then the program computes a turn value. The turn value is a percentage of the desired 80 nsec calibration voltage above the 80 nsec calibration voltage that it is desirable to make the turn in the L-cut. This voltage depends on the high frequency gain error and is chosen so that removing one or two more dots along the length of the L cut into the resistor would cause the target value to be passed; thus the voltage will quickly approach the target while the high frequency gain error is large, then turn and slowly approach it as the high frequency gain error gets nearer to the target. As long as the high frequency gain error is greater than the turn value, resistor 44 is trimmed perpendicular to the current axis with a 1 mil dot. After each 1 mil "nibble", the high frequency gain error is measured again, and the program checks to see if it greater than the turn value. When the high frequency gain error is less than or equal to the turn value, the computer 120 turns the laser to begin cutting parallel to the current axis. At this point the program also moves into the next loop. Again a delta value is defined as the difference between the previous measurements and is initially set to a number close to the expected measured delta value. The program checks first to see if the high frequency gain error is within delta of the target 80 nsec voltage, and as long as it is not, the resistor is trimmed in the loop beneath decision tree 136. In this loop, if the high frequency gain error is greater than +1.5% of the target voltage, then the laser moves along the resistor 1 mil and cuts out a dot. This type of trim along the resistor changes the resistance much less per dot than the perpendicular trim into the resistor. If the high frequency gain error is less than +1.5% of the target voltage, then the laser moves along the resistor 0.2 mils and trims out a dot. Since the size of the dot the laser attempts to cut out stays about 1 mil, moving only 0.2 mils along the resistor will result in only about a 0.2 mil being nibbled away with each cut. Thus these cuts provide much less of a resistance and voltage change compared to when the laser moved 1 mil along resistor 44. The program continues to trim out dots spaced either 1 mil or 0.2 mils along resistor 44 until another trim equal to the last rim would trim the resistor past the target value. Again the size of the trims and the percentages are chosen so that generally the trim will proceed from 1 mil trims to 0.2 mil trims. Then the program moves from decision tree 136 to the "D" loop of FIG. 11C. Before describing this "D" loop, we return up to decision tree 134. If immediately after entering the high frequency gain trim the high frequency gain error is less than 4.0% of the desired 80 nsec voltage, then the program moves to the "C" loops show in FIG. 11B. Turning to decision tree 138, if the high frequency gain error is less than +0.1%, then the program immediately moves to the "D" loop in FIG. 11C. However, if the high frequency gain error is less than or equal to 4.0% but greater than +0.1%, a reasonable delta is selected, and if delta is less than 0.35 millivolts the laser moves into resistor 44 0.5 mils in a direction perpendicular to the current axis and cuts out a dot. Thus if the high frequency gain error measured before decision tree 134 in FIG. 11A is less than 4%, the program moves the laser into the resistor more slowly than if it the high frequency gain error is greater than 4%. The program continues to cut into the resistor 0.5 mils and removing dots until either delta becomes less than 0.35 millivolts or the high frequency gain error is less than 0.1%. The computer 120 then turns the laser to move parallel to the current axis of the resistor 44, and the program moves from decision tree 140 to decision tree 142, selecting a new reasonable delta along the way. If a change of delta would not reduce the voltage below 0.0% below the desired 80 nsec voltage, then the program checks to see if the high frequency gain error is greater than +0.5%, and if so the laser moves along resistor 44 0.5 mils and cuts out a dot. The program continues to move along resistor 44 in 0.5 mil increments and cutting out dots until the high frequency gain error drops below +0.5%, at which time it moves along the resistor 0.2 mils and cuts out a dot. When the high frequency gain error minus the last change of voltage would reduce the output voltage to below 0.0% below the desired voltage, then the program moves from decision tree 142 to loop "D" in FIG. 11C.

Turning to the "D" loop in FIG. 11C, if the high frequency gain error is less than the high end specification, that is the voltage is within a specified voltage of the 80 nsec voltage, then the high frequency trim is done. However, if the high frequency gain error is greater than the high end specification, then as long as the high frequency gain error greater than zero, the laser will continue to move along resistor 44 in 0.2 mil increments and cutting out dots. Once the gain error reaches zero or less, then the high frequency gain trim is done. When the high frequency gain trim is done, the program returns to the trim subprogram of FIG. 8C at point 168, and the computer tests to see if the HF gain trim is o.k. If it is not, the computer again tests the specifications, the user is prompted to reject the part, the rejection is recorded, the program returns to the active trim subprogram at "X" in FIG. 8A, and the part is removed to the rework or scrap bins as before. If the HF gain checks out o.k., the subprogram program proceeds to the input compensation fine trim program.

Figure 12:
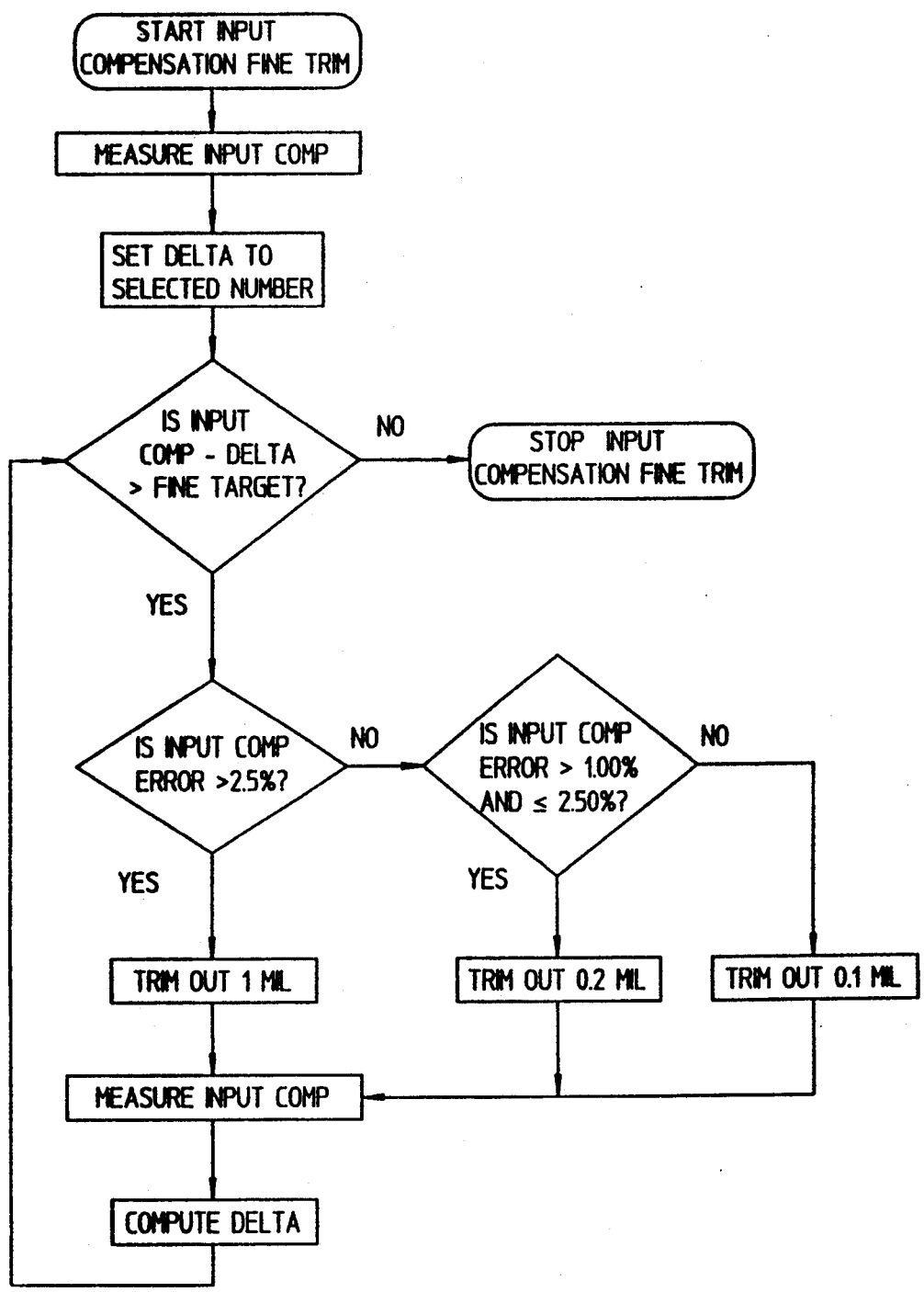
FIG. 12 is a flow chart of the preferred embodiment of the input compensation fine trim process indicated in the flow chart of FIG. 8C.

The input compensation fine trim program is shown in FIG. 12. The input compensation voltage is first measured, which, as discussed above, is the difference between the 3 nsec voltage and the 80 nsec voltage on step pulse 130 (FIG. 5). Again a delta is defined as the difference between the input compensation voltage before and after a trim. Again a reasonable value of delta is selected to begin the trim. If the input compensation voltage is within delta of the fine target voltage, then the test is done. However, if the input compensation voltage is not within delta of the fine target voltage, then the program checks to see if the input compensation error is greater than 2.5% of the 3 nsec calibration voltage. If it is, then the program trims off 1 mil from the distal end of electrode 46A (FIG. 3A). If the input compensation voltage error is less than or equal to 2.5% and greater than 1% of the 3 nsec voltage, then 0.2 mil is trimmed off electrode 46A, and if the input compensation voltage error is less than or equal to 1.0% of the 3 nsec voltage, then only 0.1 mil is trimmed off. After each trim, the input compensation voltage is remeasured and delta is recalculated. In this case also the original delta, the various percentages, and the relative sizes of the cuts are chosen so that generally the trim will proceed from a few 1 mil cuts to a few 0.2 mil cuts to the 0.1 mil cuts. When the input compensation voltage gets within delta of the fine target, the trim is done. Again the subprogram returns to the active trim subprogram, this time at point 170. The input compensation fine trim is tested and if it is not o.k., the subprogram exits via the testing of specifications and the rejection of the part through point "X" and the part is sent to rework or scrap. If the input compensation checks out o.k., test out o.k., then the posttest is performed and the operator is prompted to accept the part, the program exits through point "X", and operator places the part is in the finished trim bin when he or she removes it at point 172 in FIG. 8A. The operator then either inserts a new part and begins a new trim or halts the trim subprogram and returns to point 160 in FIG. 6, where the "halt" alternative is selected and the program is terminated.

The trim performed as just described has been found to trim the probe 3 to with in 0.1 femtofarad as judged from the flatness of the probe output. This capacitance is too small to measure directly. The trim accuracy results in a response that is flat to within 0.2% over a band width from DC to 2.5 gigahertz.

A feature of the invention is that the DC performance of the circuit 10 is trimmed to an absolute voltage, and then the AC performance is referenced to the DC trim. A related feature is that each of the three circuit portions, the DC amplifier, the AC amplifier, and the input compensation circuit are trimmed to frequencies in which their operation is dominant in the overall circuit.

Another feature of the invention is that as the trim approaches the target value, different laser cuts are used. Large cuts are made when the trim is far from the target value and smaller cuts are made as the trim approaches the target value. In the high frequency trim, a cut perpendicular to the direction of current flow in the resistor is made when the trim is far from the target value, and the cut turns and goes parallel to the axis of current flow as the trim approaches the target value. In the DC gain trim, the trim is made with a scan-type cut.

Another feature of the invention is that the trim is entirely automated and no manual adjustments are made, which greatly increases reliability with respect to the long term calibration life of the probe.

Another feature of the invention is that the trim is performed while the probe circuit 10 is enclosed within a housing 104 that is specially tooled to replicate the influence of the probe's final assembly housing on its performance. This further improves the accuracy of the trim. A related feature is that trim includes the effects of the probe housing 4 even though the trim is an active trim performed with a laser.

There has been described novel active trim apparatus and methods which permit the adjustment of the circuit compensation trim to within a tenth of a femtofarad, and has many other advantages. It should be understood that the particular embodiment shown in the drawings and described within this specification is for purposes of example and should not be construed to limit the invention which will be described in the claims below. Further, it is evident that those skilled in the art may now make numerous uses and modifications of the specific embodiment described, without departing from the inventive concepts. For example, now that it is seen to be advantageous to reference the AC trim to an absolute DC trim, many other trim configurations which accomplish the same end may be devised. Further, the invention clearly shows the advantages of adjusting the parameters of the laser cut as the trim nears the target values and the advantages of using specific cuts such as the L-cut. The invention may also be used to trim other types of circuits than that described. Or equivalent components or circuits can be substituted for the various components and Circuits described. Additional features may be added. A greater or lesser number of parts may be used. Consequently, the invention is to be construed as embracing each and every novel feature and novel combination of features present in and/or possessed by the active trim method and apparatus described.

What is claimed is:

1. Apparatus for trimming an electronic instrument comprising an electronic circuit and an instrument housing for housing said circuit when it is in use, said apparatus comprising:
   trim housing means for replicating the effect of said instrument housing on said electronic circuit; and
   trim means for trimming said electronic circuit while it is enclosed in said trim housing means.

2. Apparatus as in claim 1 wherein in said trim housing means includes one or more ports and said trim means comprises a laser for trimming said circuit through said one or more ports.

3. Apparatus as in claim 1 wherein said trim housing means comprises a clam-shell structure.

4. Apparatus as in claim 3 wherein said electronic circuit includes an input, and said trim housing means includes a contact located in a position in which said input contacts said contact when said electronic circuit is placed in said clam shell structure and said clam shell structure is closed.

5. A method of trimming an electronic instrument comprising an electronic circuit and an instrument housing for housing said circuit when said electronic circuit is in use, said method comprising the steps of:
   providing a trim housing for replicating the effect of said instrument housing on said electronic circuit;
   inserting said electronic circuit in said trim housing; and
   trimming said electronic circuit while said electronic circuit is enclosed in said trim housing.

6. A method as in claim 5 wherein in said trim housing means includes one or more ports and said step of trimming comprises:
   providing a laser, and
   using said laser to trim said circuit through said one or more ports.

7. The method of claim 5 further comprising the step of:
   connecting at least one input of said electronic circuit to said trim housing.

* * * * *

UNITED STATES PATENT AND TRADEMARK OFFICE
CERTIFICATE OF CORRECTION

PATENT NO. : 5,428,204
DATED : June 27, 1995
INVENTOR(S) : Thomas F. Uhling, et al.

It is certified that error appears in the above-indentified patent and that said Letters Patent is hereby corrected as shown below:

Col. 6, l. 18: delete "process indicated in the flow chart of Fig."

Col. 6, l. 19: delete "8C"

Figure 8C:
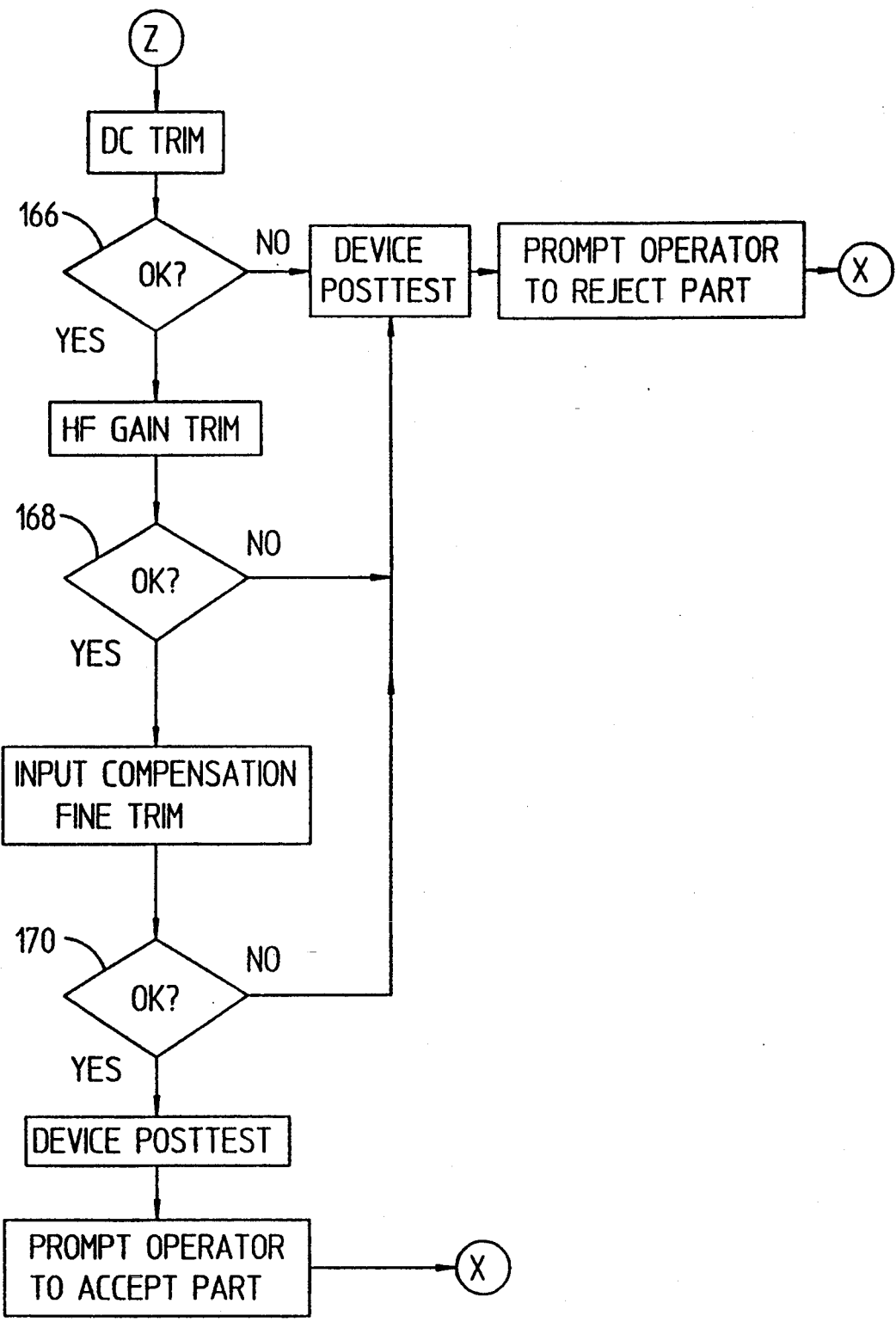

Col. 6, Between lines 19 & 20: insert new paragraph:
    --Figs. 11A through 11C are flow charts of the preferred embodiment of the high frequency gain trim process indicated in the flow chart of Fig. 8C; and --

Signed and Sealed this

Twenty-fourth Day of December, 1996

Attest:

BRUCE LEHMAN

*Attesting Officer*   *Commissioner of Patents and Trademarks*